United States Patent
Prengle

(10) Patent No.: US 11,694,920 B2
(45) Date of Patent: Jul. 4, 2023

(54) SUBSTRATE SUPPORT DEVICE, THERMAL PROCESSING APPARATUS, SUBSTRATE SUPPORT METHOD, AND THERMAL PROCESSING METHOD

(71) Applicant: SCREEN Holdings Co., Ltd., Kyoto (JP)

(72) Inventor: Scott Prengle, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/079,895

(22) Filed: Oct. 26, 2020

(65) Prior Publication Data

US 2021/0159111 A1    May 27, 2021

(30) Foreign Application Priority Data

Nov. 25, 2019  (JP) .................................. 2019-212552

(51) Int. Cl.
  *H01L 21/324*   (2006.01)
  *H01L 21/67*    (2006.01)
  (Continued)

(52) U.S. Cl.
  CPC ........ *H01L 21/6875* (2013.01); *H01L 21/324* (2013.01); *H01L 21/67011* (2013.01);
  (Continued)

(58) Field of Classification Search
  CPC ........... H01L 21/6875; H01L 21/67115; H01L 21/324; H01L 21/2686; H01L 21/68735;
  (Continued)

(56) References Cited

U.S. PATENT DOCUMENTS

| | | | | |
|---|---|---|---|---|
| 5,580,388 A | * | 12/1996 | Moore | .............. C23C 16/45589 118/500 |
| 2003/0205324 A1 | * | 11/2003 | Keeton | ............... H01L 21/6875 427/398.1 |

(Continued)

FOREIGN PATENT DOCUMENTS

| JP | H07-058039 A | 3/1995 |
|---|---|---|
| JP | 2003-045944 A | 2/2003 |

(Continued)

OTHER PUBLICATIONS

Airaksinen, Veli-Matti; "Silicon Wafer and Thin Film Measurements", Chapter 15, Handbook of Silicon Based MEMS Materials and Technologies. Elsevier Inc., DOI: http://dx.doi.org/10.1016/B978-0-323-29965-7.00015-4, pp. 381-390. (Year: 2015).*

(Continued)

*Primary Examiner* — Mary A Wilczewski
(74) *Attorney, Agent, or Firm* — Ostrolenk Faber LLP

(57) ABSTRACT

A substrate support device relating to technology disclosed in the description of the present application includes: a holding plate for opposing a substrate bowable by being heated by irradiation with flash light; and a plurality of substrate support pins provided on the holding plate and being for supporting the substrate, wherein the plurality of substrate support pins are arranged at locations where a volume of a space between the holding plate and the substrate in an unbowed state and a volume of a space between the holding plate and the substrate in a bowed state are equal to each other. Breakage of the substrate can be suppressed in a case where the substrate is bowed by flash light.

2 Claims, 13 Drawing Sheets

(51) Int. Cl.
  *H01L 21/687* (2006.01)
  *H01L 21/268* (2006.01)
  *H05B 3/00* (2006.01)
  *H01L 21/677* (2006.01)

(52) U.S. Cl.
  CPC .... *H01L 21/67115* (2013.01); *H01L 21/2686* (2013.01); *H01L 21/67248* (2013.01); *H01L 21/67742* (2013.01); *H01L 21/68707* (2013.01); *H01L 21/68735* (2013.01); *H05B 3/0047* (2013.01)

(58) Field of Classification Search
  CPC ......... H01L 21/68707; H01L 21/67248; H01L 21/67742; H01L 21/67011; H05B 3/0047
  See application file for complete search history.

(56) References Cited

U.S. PATENT DOCUMENTS

| | | | | |
|---|---|---|---|---|
| 2004/0112890 | A1* | 6/2004 | Kusuda | H05B 3/0047 219/520 |
| 2005/0133167 | A1* | 6/2005 | Camm | H01L 21/6875 156/345.51 |
| 2009/0175605 | A1* | 7/2009 | Kobayashi | H01L 21/67115 392/416 |
| 2011/0168330 | A1 | 7/2011 | Sakaue et al. | |
| 2012/0269498 | A1* | 10/2012 | Kang | H01L 21/67115 392/416 |
| 2014/0235072 | A1 | 8/2014 | Ito | |
| 2016/0284575 | A1* | 9/2016 | Ito | H01L 21/67115 |
| 2018/0067403 | A1* | 3/2018 | deVilliers | G06F 30/23 |
| 2018/0068859 | A1* | 3/2018 | deVilliers | H01L 22/12 |
| 2018/0068860 | A1* | 3/2018 | deVilliers | H01L 21/027 |
| 2018/0068861 | A1* | 3/2018 | deVilliers | H01L 21/0274 |
| 2018/0240689 | A1* | 8/2018 | Kitazawa | H01L 21/681 |
| 2020/0058509 | A1* | 2/2020 | deVilliers | G06F 30/23 |
| 2020/0098601 | A1* | 3/2020 | Ueno | H01L 21/67115 |
| 2020/0126808 | A1* | 4/2020 | Ikeda | H01L 21/6875 |
| 2020/0381273 | A1* | 12/2020 | Shigemasu | H01L 21/67248 |
| 2021/0125853 | A1* | 4/2021 | Rathi | H01L 21/67115 |
| 2021/0159111 | A1* | 5/2021 | Prengle | H01L 21/6875 |
| 2021/0351058 | A1* | 11/2021 | Murakami | H01J 37/3244 |
| 2022/0076988 | A1* | 3/2022 | Chen | H01L 21/6875 |

FOREIGN PATENT DOCUMENTS

| | | | | |
|---|---|---|---|---|
| JP | 2004-186542 | A | | 7/2004 |
| JP | 2009-177062 | A | | 8/2009 |
| JP | 2010-080614 | A | | 4/2010 |
| JP | 2011-166107 | A | | 8/2011 |
| JP | 2014-157968 | A | | 8/2014 |
| KR | 20140143852 | | * 12/2014 | ........ H01L 21/67115 |
| KR | 10-2018-0096501 | | * 8/2018 | ........... H01L 21/324 |
| WO | WO 2019/049588 | | * 3/2019 | ......... H01L 21/6875 |

OTHER PUBLICATIONS

Request for the Submission of an Opinion dated Jun. 28, 2022 in counterpart Korean Patent Application No. 10-2020-0156477 and machine English translation obtained from the JPO.

Notice of Decision to Grant dated Dec. 29, 2022 in corresponding Korean Patent Application No. 10-2020-0156477.

Notice of Reasons for Refusal dated Apr. 18, 2023 in corresponding Japanese Patent Application No. 2019-212552 and a machine English language translation obtained from the JPO.

* cited by examiner

F I G. 1 2
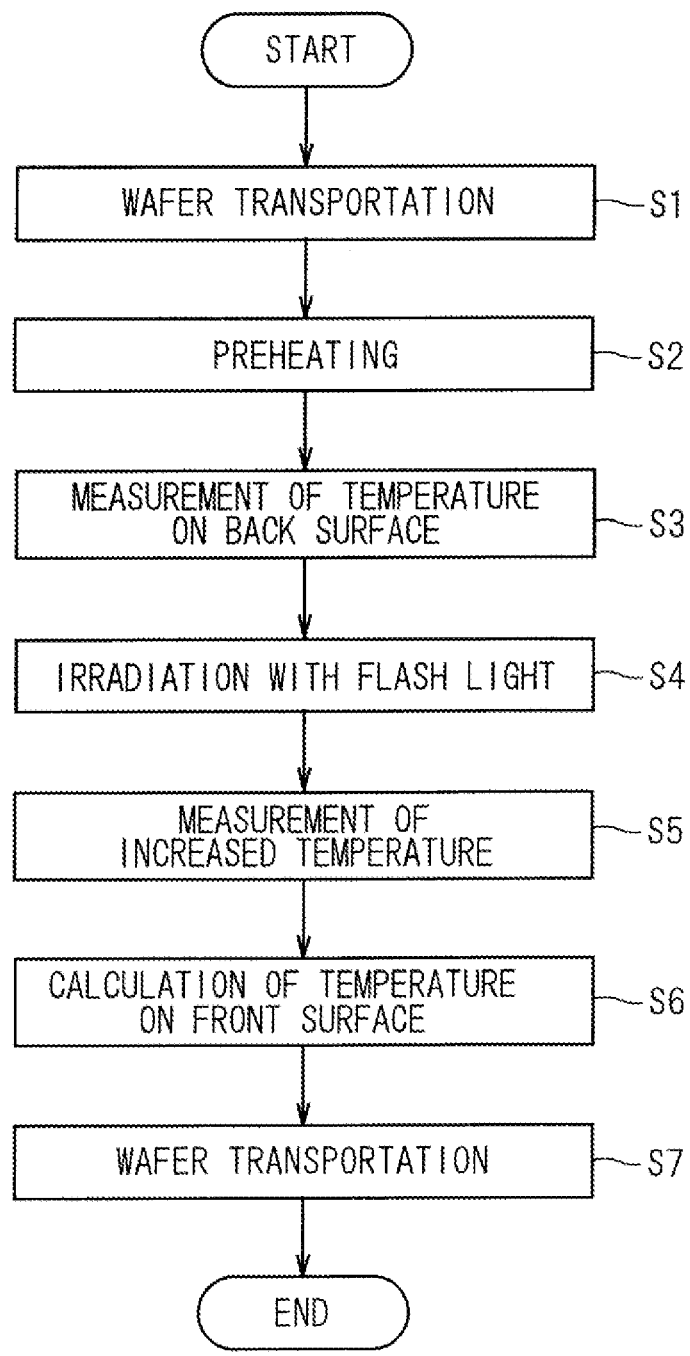

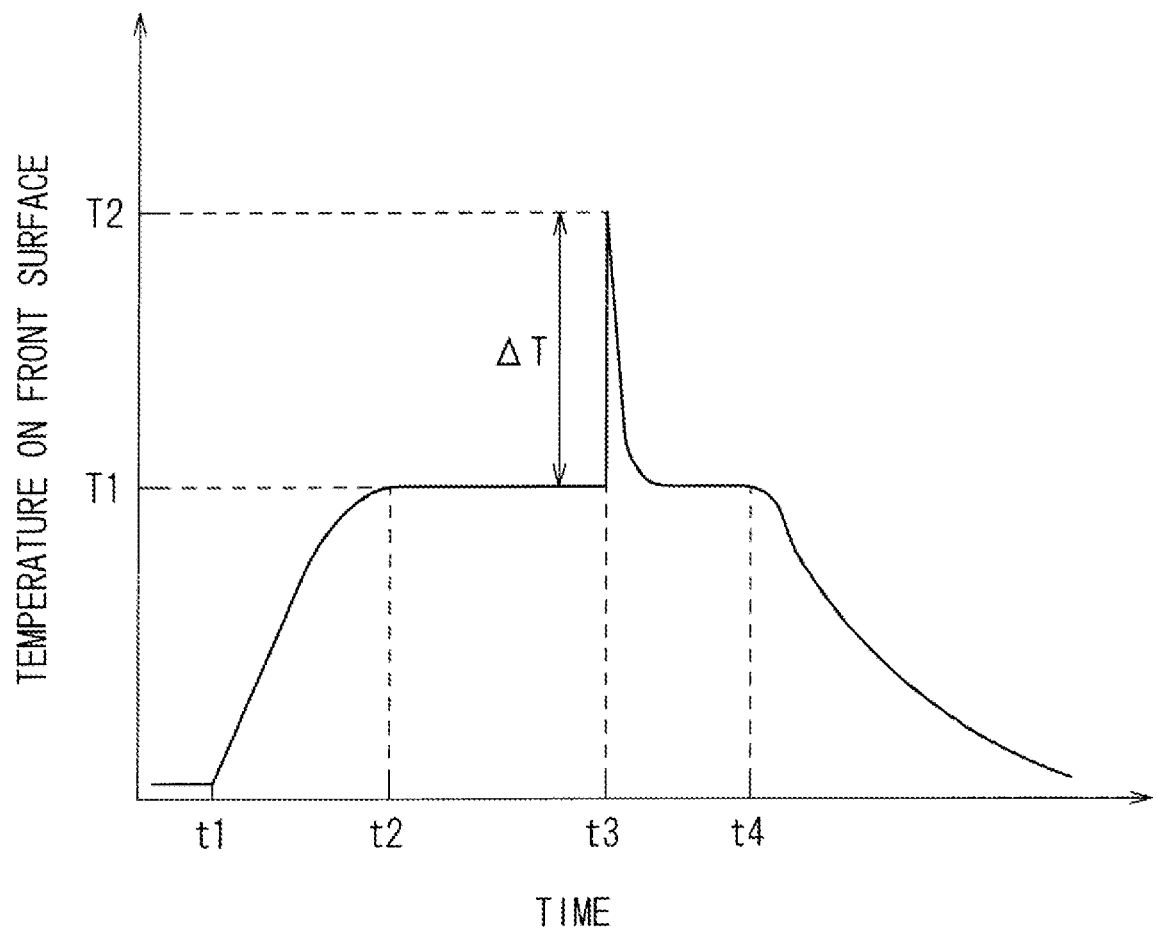
F I G. 1 3

SUBSTRATE SUPPORT DEVICE, THERMAL PROCESSING APPARATUS, SUBSTRATE SUPPORT METHOD, AND THERMAL PROCESSING METHOD

BACKGROUND OF THE INVENTION

Field of the Invention

Technology disclosed in the description of the present application relates to substrate support devices, thermal processing apparatuses, substrate support methods, and thermal processing methods.

Description of the Background Art

In a process of manufacturing a semiconductor device, a step of introducing impurities is necessary to form a pn junction and the like within a laminar precision electronic substrate (hereinafter, also simply referred to as a "substrate"), such as a semiconductor wafer. Impurities are typically introduced by ion implantation and annealing thereafter.

Ion implantation is technology of bombarding ionized elements of impurities, such as boron (B), arsenic (As), and phosphorus (P), with the semiconductor wafer at a highly accelerated voltage to physically inject the impurities.

The injected impurities are activated by annealing. In this case, if an annealing time is about a few seconds or more, implanted impurities are diffused to a greater depth by heat, and, as a result, a junction is formed at a depth greater than a desired depth. This can interfere with favorable device formation.

As annealing technology to heat the semiconductor wafer in an extremely short time, flash lamp annealing (FLA) is attracting attention. FLA is thermal processing technology of irradiating a surface of the semiconductor wafer with flash light using a xenon flash lamp (a simple term "flash lamp" hereinafter refers to the xenon flash lamp) to increase the temperature on only the surface of the semiconductor wafer into which impurities have been injected in an extremely short time (e.g., a few milliseconds or less).

Radiation spectral distribution of the xenon flash lamp is in an ultraviolet range to a near infrared range, has a shorter wavelength than that of a conventional halogen lamp, and is substantially coincident with a fundamental absorption band of a semiconductor wafer made of silicon. Thus, in a case where the semiconductor wafer is irradiated with flash light from the xenon flash lamp, the temperature of the semiconductor wafer can rapidly be increased because less light is transmitted. Irradiation with flash light in an extremely short time of a few milliseconds or less is also found to be able to selectively increase the temperature of only a portion near the surface of the semiconductor wafer. An increase in temperature in an extremely short time using the xenon flash lamp can thus activate impurities without diffusing the impurities to a greater depth.

For example, Japanese Patent Application Laid-Open No. 2004-186542 discloses a flash lamp annealing apparatus that irradiates, after preheating a semiconductor wafer using a heating plate disposed below a processing chamber, a surface of the semiconductor wafer with flash light from a flash lamp disposed above the processing chamber.

Flash light emitted from the flash lamp is light having high energy, so that the temperature on a surface of a substrate, such as a semiconductor wafer, irradiated with flash light increases in a short time. If raid thermal expansion occurs on the surface of the substrate irradiated with flash light, the substrate can be bowed so that the surface thereof is convex.

The substrate supported by support pins can be displaced by the bow, and can jump from the support pins due to displacement. The substrate having jumped from the support pins can be broken when being in contact with the support pins again.

SUMMARY

The present invention is directed to a substrate support device, a thermal processing apparatus, a substrate support method, and a thermal processing method.

In one aspect of the present invention, a substrate support device includes: a holding plate for opposing a substrate bowable by being heated by irradiation with flash light; and a plurality of substrate support pins provided on the holding plate and being for supporting the substrate, wherein the plurality of substrate support pins are arranged at locations where a volume of a space between the holding plate and the substrate in an unbowed state and a volume of a space between the holding plate and the substrate in a bowed state are equal to each other.

Even in a case where a semiconductor wafer is bowed by flash light, a jump of the semiconductor wafer from the substrate support pins can be suppressed, and, as a result, breakage of the semiconductor wafer can be suppressed.

In another aspect of the present invention, a substrate support method includes the steps of: opposing a holding plate on which a plurality of substrate support pins are provided with a substrate bowable by being heated by irradiation with flash light, the plurality of substrate support pins being for supporting the substrate; and arranging the plurality of substrate support pins at locations where a volume of a space between the holding plate and the substrate in an unbowed state and a volume of a space between the holding plate and the substrate in a bowed state are equal to each other.

Even in a case where a semiconductor wafer is bowed by flash light, a jump of the semiconductor wafer from the substrate support pins can be suppressed, and, as a result, breakage of the semiconductor wafer can be suppressed.

It is thus an object of the present invention to suppress breakage of a substrate in a case where the substrate is bowed by flash light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a flowchart showing procedures of processing of the semiconductor wafer;

FIG. 13 shows a change in temperature on a front surface of the semiconductor wafer;

DESCRIPTION OF THE PREFERRED EMBODIMENTS

An embodiment will be described below with reference the accompanying drawings. In the embodiment below, detailed features and the like are shown for description of technology, but they are examples and are not necessary features to implement the embodiment.

The drawings are schematically shown, and configurations are omitted or simplified as appropriate for the convenience of description. The sizes of and a positional relationship among configurations shown in different drawings are not necessarily accurate, and can be changed as appropriate. Hatching is sometimes applied to drawings other than a sectional view, such as a plan view, for ease of understanding of the embodiment.

In description made below, similar components bear the same reference signs, and have similar names and functions. Detailed description thereof is thus sometimes omitted to avoid redundancy.

In description made below, an expression "comprising", "including", or "having" a certain component is not an exclusive expression excluding the presence of the other components unless otherwise noted.

In description made below, expressions indicating relative or absolute positional relationships, such as "in one direction", "along one direction", "parallel", "orthogonal", "central", "concentric", and "coaxial", include those exactly indicating the positional relationships and those in a case where an angle or a distance is changed within tolerance or to the extent that similar functions can be obtained unless otherwise noted.

In description made below, expressions indicating equality, such as "same", "equal", "uniform", and "homogeneous", include those indicating exact equality and those in a case where there is a difference within tolerance or to the extent that similar functions can be obtained unless otherwise noted.

In description made below, terms representing specific locations or directions, such as "upper", "lower", "left", "right", "side", "bottom", "front", and "back", may be used. These terms, however, are used for the sake of convenience for ease of understanding of the embodiment, and do not relate to locations or directions in actual use.

In description made below, expressions "an upper surface of . . . " or "a lower surface of . . . " include not only an upper surface or a lower surface of a target component itself but also a state of another component being formed on the upper surface or the lower surface of the target component. That is to say, an expression "A provided on an upper surface of B" does not prevent another component "C" from being interposed between A and B.

Embodiment

A substrate support device, a thermal processing apparatus, a substrate support method, and a thermal processing method according to the present embodiment will be described below.

<Configuration of Thermal Processing Apparatus>

Figure 1:
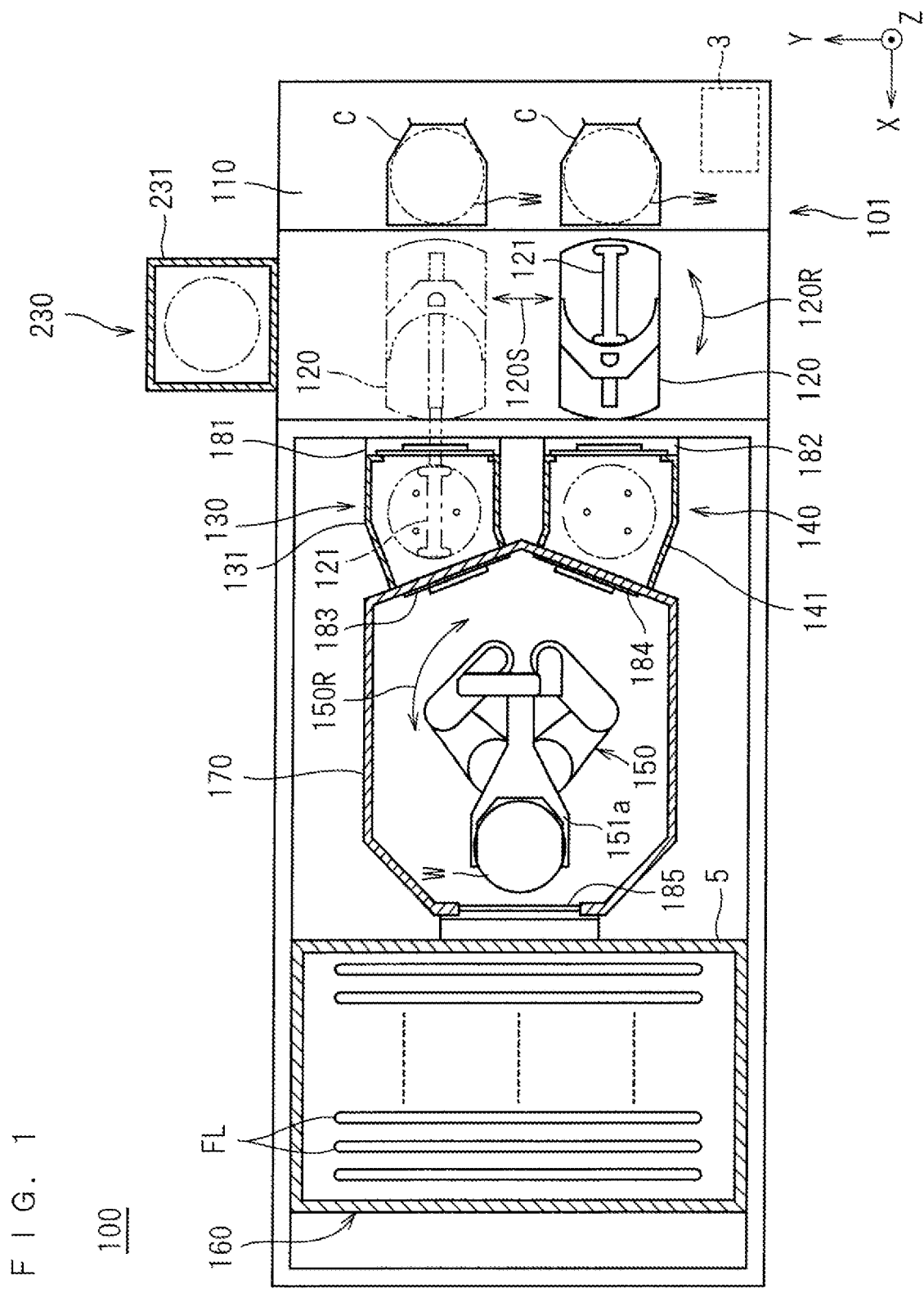
FIG. 1 is a plan view schematically showing an example of a configuration of a thermal processing apparatus according to an embodiment.
Figure 2:
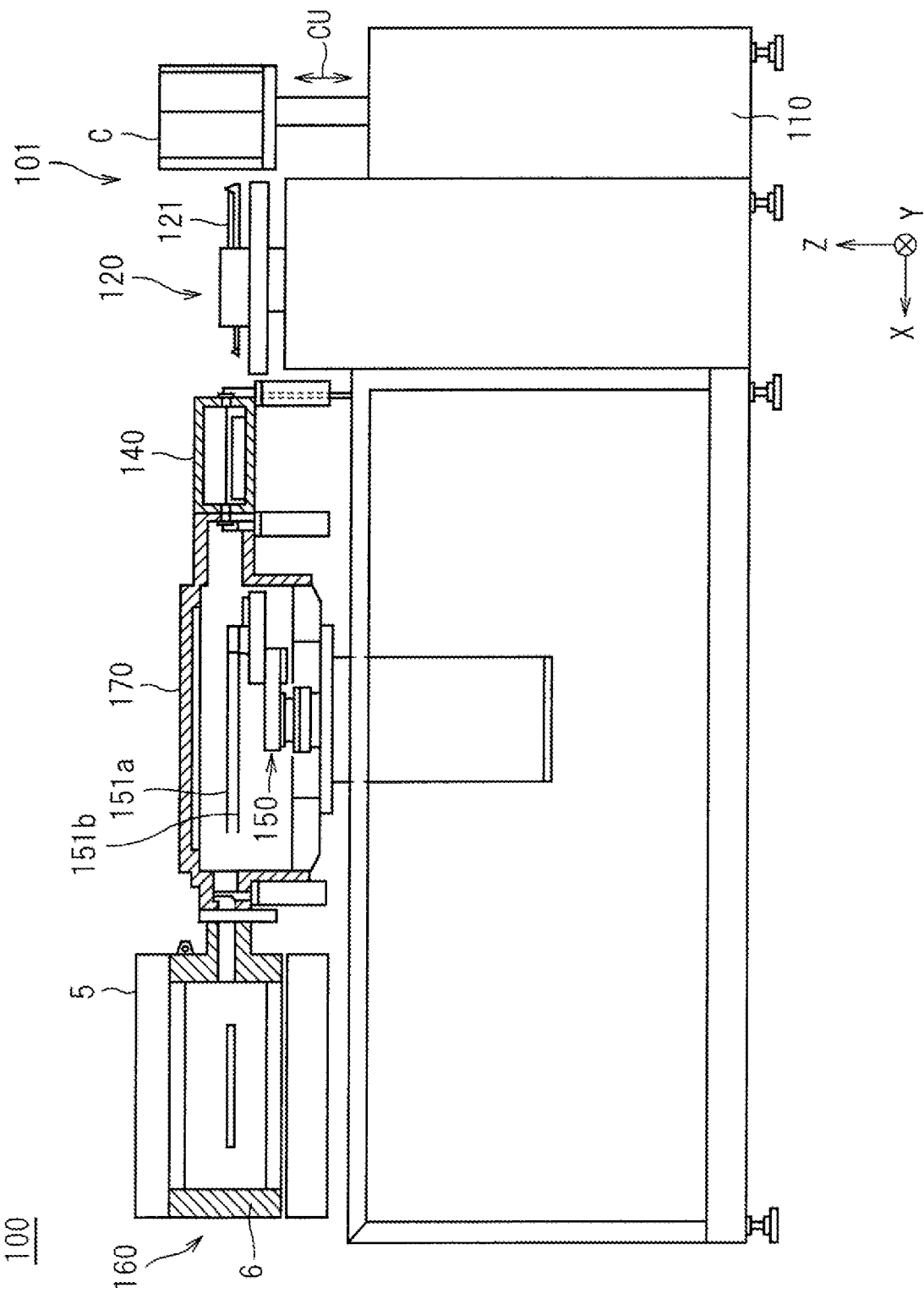
FIG. 2 is an elevation view schematically showing the example of the configuration of the thermal processing apparatus according to the embodiment.

FIG. 1 is a plan view schematically showing an example of a configuration of a thermal processing apparatus 100 according to the present embodiment. FIG. 2 is an elevation view schematically showing the example of the configuration of the thermal processing apparatus 100 according to the present embodiment.

As illustrated in FIG. 1, the thermal processing apparatus 100 is a flash lamp annealing apparatus irradiating a disk-shaped semiconductor wafer W as a substrate with flash light to heat the semiconductor wafer W.

The size of the semiconductor wafer W to be processed is not particularly limited, but the semiconductor wafer W is a circular semiconductor wafer having a diameter of 300 mm or 450 mm, for example.

As illustrated in FIGS. 1 and 2, the thermal processing apparatus 100 includes: an indexer unit 101 transporting an unprocessed semiconductor wafer W from the outside to the inside of the apparatus and transporting a processed semiconductor wafer W to the outside of the apparatus; an alignment unit 230 positioning the unprocessed semiconductor wafer W; two cooling units, namely, a cooling unit 130 and a cooling unit 140, cooling a heated semiconductor wafer W; a thermal processing unit 160 flash heating the semiconductor wafer W; and a transport robot 150 transferring the semiconductor wafer W to the cooling unit 130, the cooling unit 140, and the thermal processing unit 160.

The thermal processing apparatus 100 also includes a controller 3 controlling an operation mechanism provided in each of the above-mentioned processing units and the transport robot 150 to proceed with flash heating of the semiconductor wafer W.

The indexer unit 101 includes a load port 110 on which a plurality of carriers C (two carriers C in the present embodiment) are mounted side by side, and a transfer robot 120 taking the unprocessed semiconductor wafer W out of each of the carriers C and storing the processed semiconductor wafer W in each of the carriers C.

A carrier C for storing the unprocessed semiconductor wafer W is transported by an automated guide vehicle (AGV), an overhead hoist transfer (OHT), and the like and is mounted on the load port 110, and a carrier C for storing the processed semiconductor wafer W is taken away from the load port 110 by the AGV.

In the load port 110, the carriers C are each configured to be movable upward and downward as shown by an arrow CU of FIG. 2 so that the transfer robot 120 can take any semiconductor wafer W into and out of the carrier C.

Each of the carriers C may be in a form of not only a front opening unified pod (FOUP) storing the semiconductor wafer W in an enclosed space but also a standard mechanical inter face (SMIF) pod or an open cassette (OC) exposing the stored semiconductor wafer W to outside air.

The transfer robot 120 is slidably movable as shown by an arrow 120S of FIG. 1, and can perform rotation operation as shown by an arrow 120R of FIG. 1 and upward and downward operation. The transfer robot 120 thereby takes the semiconductor wafer W into and out of each of the two carriers C, and transfers the semiconductor wafer W to the alignment unit 230 and the two cooling units 130 and 140.

The transfer robot 120 takes the semiconductor wafer W into and out of each of the carriers C through slide movement of a hand 121 and upward and downward movement of the carrier C. The transfer robot 120 transfers the semiconductor wafer W to the alignment unit 230 or the cooling unit 130 (cooling unit 140) through slide movement of the hand 121 and upward and downward operation of the transfer robot 120.

The alignment unit 230 is connected to a side of the indexer unit 101 along a Y-axis direction. The alignment unit 230 is a processing unit rotating the semiconductor wafer W in a horizontal plane to orient the semiconductor wafer W in a direction suitable for flash heating. The alignment unit 230 is configured to include, within an alignment chamber 231 as a housing made of an aluminum alloy, a mechanism to rotate the semiconductor wafer W while supporting the semiconductor wafer W in a horizontal position, a mechanism to optically detect any notch or orientation flat formed at the periphery of the semiconductor wafer W, and the like.

The semiconductor wafer W is transferred to the alignment unit 230 by the transfer robot 120. The transfer robot 120 transfers the semiconductor wafer W to the alignment chamber 231 so that the center of the wafer is at a predetermined location.

The alignment unit 230 rotates the semiconductor wafer W received from the indexer unit 101 around an axis in the vertical direction with a center portion of the semiconductor wafer W as a rotation center, and optically detects the notch and the like to adjust the orientation of the semiconductor wafer W. The semiconductor wafer W whose orientation has been adjusted is taken out of the alignment chamber 231 by the transfer robot 120.

A transport chamber 170 storing the transport robot 150 is provided as a space for the transport robot 150 to transport the semiconductor wafer W. A chamber 6 of the thermal processing unit 160, a first cooling chamber 131 of the cooling unit 130, and a second cooling chamber 141 of the cooling unit 140 are connected in communication with respective three sides of the transport chamber 170.

The thermal processing unit 160 as a main component of the thermal processing apparatus 100 is a substrate processing unit irradiating the semiconductor wafer W having undergone preheating (assist heating) with flash light from xenon flash lamps FL to flash heat the semiconductor wafer W. A configuration of the thermal processing unit 160 will further be described below.

The two cooling units 130 and 140 have substantially similar configurations. The cooling unit 130 and the cooling unit 140 each include, within the first cooling chamber 131 or the second cooling chamber 141 as a housing made of an aluminum alloy, a cooling plate (not illustrated) made of metal and a quartz plate (not illustrated) mounted on an upper surface of the cooling plate. The temperature of the cooling plate is adjusted to room temperature (approximately 23° C.) by a Peltier device or through thermostatic water circulation.

The semiconductor wafer W flash heated by the thermal processing unit 160 is transported to the first cooling chamber 131 or the second cooling chamber 141, and is mounted on the quartz plate to be cooled.

The first cooling chamber 131 and the second cooling chamber 141 are each located between the indexer unit 101 and the transport chamber 170, and connected to both the indexer unit 101 and the transport chamber 170.

The first cooling chamber 131 and the second cooling chamber 141 each have two openings for transporting the semiconductor wafer W to and from them. One of the two openings of the first cooling chamber 131 connected to the indexer unit 101 is openable and closable by a gate valve 181.

On the other hand, an opening of the first cooling chamber 131 connected to the transport chamber 170 is openable and closable by a gate valve 183. That is to say, the first cooling chamber 131 and the indexer unit 101 are connected to each other through the gate valve 181, and the first cooling chamber 131 and the transport chamber 170 are connected to each other through the gate valve 183.

The gate valve 181 is opened when the semiconductor wafer W is transferred between the indexer unit 101 and the first cooling chamber 131. The gate valve 183 is opened when the semiconductor wafer W is transferred between the first cooling chamber 131 and the transport chamber 170. The inside of the first cooling chamber 131 is an enclosed space when the gate valve 181 and the gate valve 183 are closed.

One of the two openings of the second cooling chamber 141 connected to the indexer unit 101 is openable and closable by a gate valve 182. On the other hand, an opening of the second cooling chamber 141 connected to the transport chamber 170 is openable and closable by a gate valve 184. That is to say, the second cooling chamber 141 and the indexer unit 101 are connected to each other through the gate valve 182, and the second cooling chamber 141 and the transport chamber 170 are connected to each other through the gate valve 184.

The gate valve 182 is opened when the semiconductor wafer W is transferred between the indexer unit 101 and the second cooling chamber 141. The gate valve 184 is opened when the semiconductor wafer W is transferred between the second cooling chamber 141 and the transport chamber 170. The inside of the second cooling chamber 141 is an enclosed space when the gate valve 182 and the gate valve 184 are closed.

The transport robot 150 provided in the transport chamber 170 installed adjacent to the chamber 6 can rotate around an axis along the vertical direction as shown by an arrow 150R. The transport robot 150 has two link mechanisms composed of a plurality of arm segments, and a transport hand 151*a* and a transport hand 151*b* for holding the semiconductor wafer W are provided at respective leading ends of the two link mechanisms. The transport hand 151*a* and the transport hand 151*b* are arranged with a predetermined pitch therebetween in the vertical direction, and are linearly slidably movable in the same horizontal direction by the link mechanisms independently of each other.

The transport robot 150 also moves a base on which the two link mechanisms are provided upward and downward to move the transport hand 151a and the transport hand 151b upward and downward while maintaining the predetermined pitch therebetween.

When transferring (taking) the semiconductor wafer W to or from (into or out of) the first cooling chamber 131, the second cooling chamber 141, or the chamber 6 of the thermal processing unit 160, the transport robot 150 first rotates so that both the transport hand 151a and the transport hand 151b oppose the chamber to or from which the semiconductor wafer W is transferred, and, after rotation (or during rotation), moves upward and downward to be located at a level where the semiconductor wafer W is transferred to or from the chamber using one of the transport hands. The transport hand 151a (151b) is then linearly slidably moved in the horizontal direction to transfer the semiconductor wafer W to or from the chamber.

The semiconductor wafer W can be transferred between the transport robot 150 and the transfer robot 120 through the cooling unit 130 and the cooling unit 140. That is to say, the first cooling chamber 131 of the cooling unit 130 and the second cooling chamber 141 of the cooling unit 140 function as paths to transfer the semiconductor wafer W between the transport robot 150 and the transfer robot 120. Specifically, the semiconductor wafer W passed by one of the transport robot 150 and the transfer robot 120 to the first cooling chamber 131 or the second cooling chamber 141 is received by the other one of the transport robot 150 and the transfer robot 120 to transfer the semiconductor wafer W. The transport robot 150 and the transfer robot 120 constitute a transport mechanism to transport the semiconductor wafer W from the carriers C to the thermal processing unit 160.

As described above, the gate valve 181 is provided between the first cooling chamber 131 and the indexer unit 101, and the gate valve 182 is provided between the second cooling chamber 141 and the indexer unit 101. The gate valve 183 is provided between the transport chamber 170 and the first cooling chamber 131, and the gate valve 184 is provided between the transport chamber 170 and the second cooling chamber 141. Furthermore, a gate valve 185 is provided between the transport chamber 170 and the chamber 6 of the thermal processing unit 160. These gate valves are opened and closed as appropriate when the semiconductor wafer W is transported within the thermal processing apparatus 100.

Figure 3:
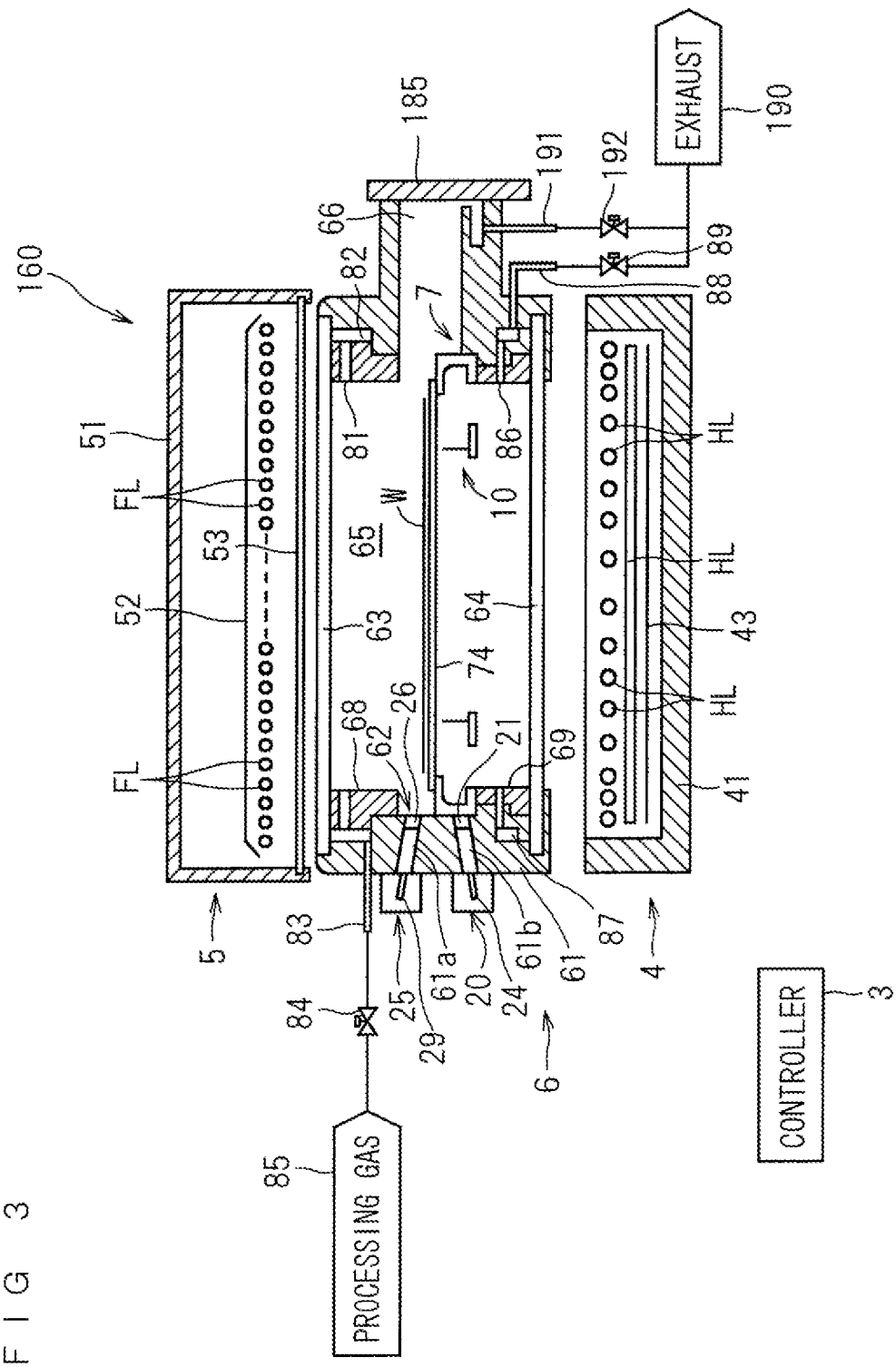
FIG. 3 is a sectional view schematically showing an example of a configuration of a thermal processing unit of the thermal processing apparatus according to the embodiment.

FIG. 3 is a sectional view schematically showing a configuration of the thermal processing unit 160 of the thermal processing apparatus 100 according to the present embodiment.

As illustrated in FIG. 3, the thermal processing unit 160 is a flash lamp annealing apparatus irradiating the disk-shaped semiconductor wafer W as the substrate with flash light to heat the semiconductor wafer W.

The size of the semiconductor wafer W to be processed is not particularly limited, but the semiconductor wafer W has a diameter of 300 mm or 450 mm (300 mm in the present embodiment), for example.

The thermal processing unit 160 includes the chamber 6 for storing the semiconductor wafer W, a flash heating unit 5 incorporating a plurality of flash lamps FL, and a halogen heating unit 4 incorporating a plurality of halogen lamps HL. The flash heating unit 5 is provided above the chamber 6, and the halogen heating unit 4 is provided below the chamber 6.

The thermal processing unit 160 also includes, within the chamber 6, a holding unit 7 for holding the semiconductor wafer W in the horizontal position and a transfer mechanism 10 for transferring the semiconductor wafer W between the holding unit 7 and the outside of the apparatus.

The thermal processing unit 160 further includes the controller 3 controlling each operation mechanism provided in the halogen heating unit 4, the flash heating unit 5, and the chamber 6 to perform thermal processing of the semiconductor wafer W.

The chamber 6 includes a tubular chamber side portion 61 and chamber windows made of quartz attached to the top and bottom of the chamber side portion 61. The chamber side portion 61 has a substantially tubular shape with its top and bottom opened. An upper chamber window 63 is attached to an upper opening for blocking, and a lower chamber window 64 is attached to a lower opening for blocking.

The upper chamber window 63 forming a ceiling of the chamber 6 is a disk-shaped member made of quartz, and functions as a quartz window transmitting flash light emitted from the flash heating unit 5 to the inside of the chamber 6.

The lower chamber window 64 forming a floor of the chamber 6 is also a disk-shaped member made of quartz, and functions as a quartz window transmitting light emitted from the halogen heating unit 4 to the inside of the chamber 6.

A reflective ring 68 is attached to an upper portion of an inner wall surface of the chamber side portion 61, and a reflective ring 69 is attached to a lower portion of the inner wall surface of the chamber side portion 61. The reflective ring 68 and the reflective ring 69 are each formed to be annular.

The reflective ring 68 on an upper side is attached by being fit to the chamber side portion 61 from above. On the other hand, the reflective ring 69 on a lower side is attached by being fit to the chamber side portion 61 from below and fastened with screws, which are not illustrated. That is to say, the reflective ring 68 and the reflective ring 69 are each detachably attached to the chamber side portion 61.

A space inside the chamber 6, that is, a space enclosed by the upper chamber window 63, the lower chamber window 64, the chamber side portion 61, the reflective ring 68, and the reflective ring 69 is defined as a thermal processing space 65.

By attaching the reflective ring 68 and the reflective ring 69 to the chamber side portion 61, a recess 62 is formed in the inner wall surface of the chamber 6. That is to say, the recess 62 surrounded by a central portion of the inner wall surface of the chamber side portion 61 to which the reflective ring 68 and the reflective ring 69 have not been attached, a lower end surface of the reflective ring 68, and an upper end surface of the reflective ring 69 is formed.

The recess 62 is formed in the inner wall surface of the chamber 6 to be annular along the horizontal direction, and surrounds the holding unit 7 for holding the semiconductor wafer W. The chamber side portion 61, the reflective ring 68, and the reflective ring 69 are each made of metallic material (e.g., stainless steel) having high strength and excellent heat resistance.

A transport opening (furnace mouth) 66 to transport the semiconductor wafer W to and from the chamber 6 is formed in the chamber side portion 61. The transport opening 66 is openable and closable by the gate valve 185. The transport opening 66 is connected in communication with an outer circumferential surface of the recess 62.

The semiconductor wafer W can thus be transported from the transport opening 66 to the thermal processing space 65 through the recess 62 and be transported from the thermal processing space 65 when the gate valve 185 opens the transport opening 66. The thermal processing space 65 inside the chamber 6 becomes the enclosed space when the gate valve 185 closes the transport opening 66.

Furthermore, the chamber side portion 61 has a through hole 61a and a through hole 61b. The through hole 61a is a cylindrical hole for guiding infrared light radiated from an upper surface of the semiconductor wafer W held by a susceptor 74, which will be described below, to an infrared sensor 29 of an upper radiation thermometer 25. On the other hand, the through hole 61b is a cylindrical hole for guiding infrared light radiated from a lower surface of the semiconductor wafer W to an infrared sensor 24 of a lower radiation thermometer 20. The through hole 61a and the through hole 61b are inclined with respect to the horizontal direction so that axes thereof in a direction of penetration cross the main surface of the semiconductor wafer W held by the susceptor 74.

The infrared sensor 29 is, for example, a quantum infrared sensor. The infrared sensor 24 is, for example, a pyroelectric sensor utilizing a pyroelectric effect, a thermopile utilizing the Seebeck effect, or a thermal infrared sensor, such as a bolometer, utilizing a change in resistance of a semiconductor by heat.

A transparent window 26 made of a calcium fluoride material transmitting infrared light in a wavelength region allowing for measurement by the upper radiation thermometer 25 is attached to an end of the through hole 61a facing the thermal processing space 65. A transparent window 21 made of a barium fluoride material transmitting infrared light in a wavelength region allowing for measurement by the lower radiation thermometer 20 is attached to an end of the through hole 61b facing the thermal processing space 65.

A gas supply hole 81 for supplying processing gas to the thermal processing space 65 is formed in an upper portion of an inner wall of the chamber 6. The gas supply hole 81 is located above the recess 62, and may be formed in the reflective ring 68. The gas supply hole 81 is connected in communication with a gas supply tube 83 through a buffer space 82 formed to be annular inside a side wall of the chamber 6.

The gas supply tube 83 is connected to a processing gas supply source 85. A valve 84 is inserted along a path of the gas supply tube 83. When the valve 84 is opened, the processing gas is supplied from the processing gas supply source 85 to the buffer space 82.

The processing gas having flowed in the buffer space 82 flows throughout the buffer space 82 having a lower fluid resistance than the gas supply hole 81, and is supplied to the thermal processing space 65 through the gas supply hole 81. As the processing gas, inert gas, such as nitrogen ($N_2$), reactive gas, such as hydrogen ($H_2$) and ammonia ($NH_3$), or mixed gas as a mixture of them can be used (nitrogen gas in the present embodiment).

On the other hand, a gas exhaust hole 86 for exhausting gas within the thermal processing space 65 is formed in a lower portion of the inner wall of the chamber 6. The gas exhaust hole 86 is located below the recess 62, and may be formed in the reflective ring 69. The gas exhaust hole 86 is connected in communication with a gas exhaust tube 88 through a buffer space 87 formed to be annular inside the side wall of the chamber 6. The gas exhaust tube 88 is connected to an exhaust unit 190. A valve 89 is inserted along a path of the gas exhaust tube 88. When the valve 89 is opened, gas within the thermal processing space 65 is exhausted from the gas exhaust hole 86 to the gas exhaust tube 88 through the buffer space 87.

The gas supply hole 81 and the gas exhaust hole 86 may each include a plurality of holes arranged along the circumference of the chamber 6, and may each be a slit. The processing gas supply source 85 and the exhaust unit 190 may each be a mechanism provided in the thermal processing unit 160, and may each be a utility of a plant in which the thermal processing unit 160 is installed.

A gas exhaust tube 191 for exhausting gas within the thermal processing space 65 is also connected to a leading end of the transport opening 66. The gas exhaust tube 191 is connected to the exhaust unit 190 through a valve 192. Gas within the chamber 6 is exhausted through the transport opening 66 by opening the valve 192.

Figure 4:
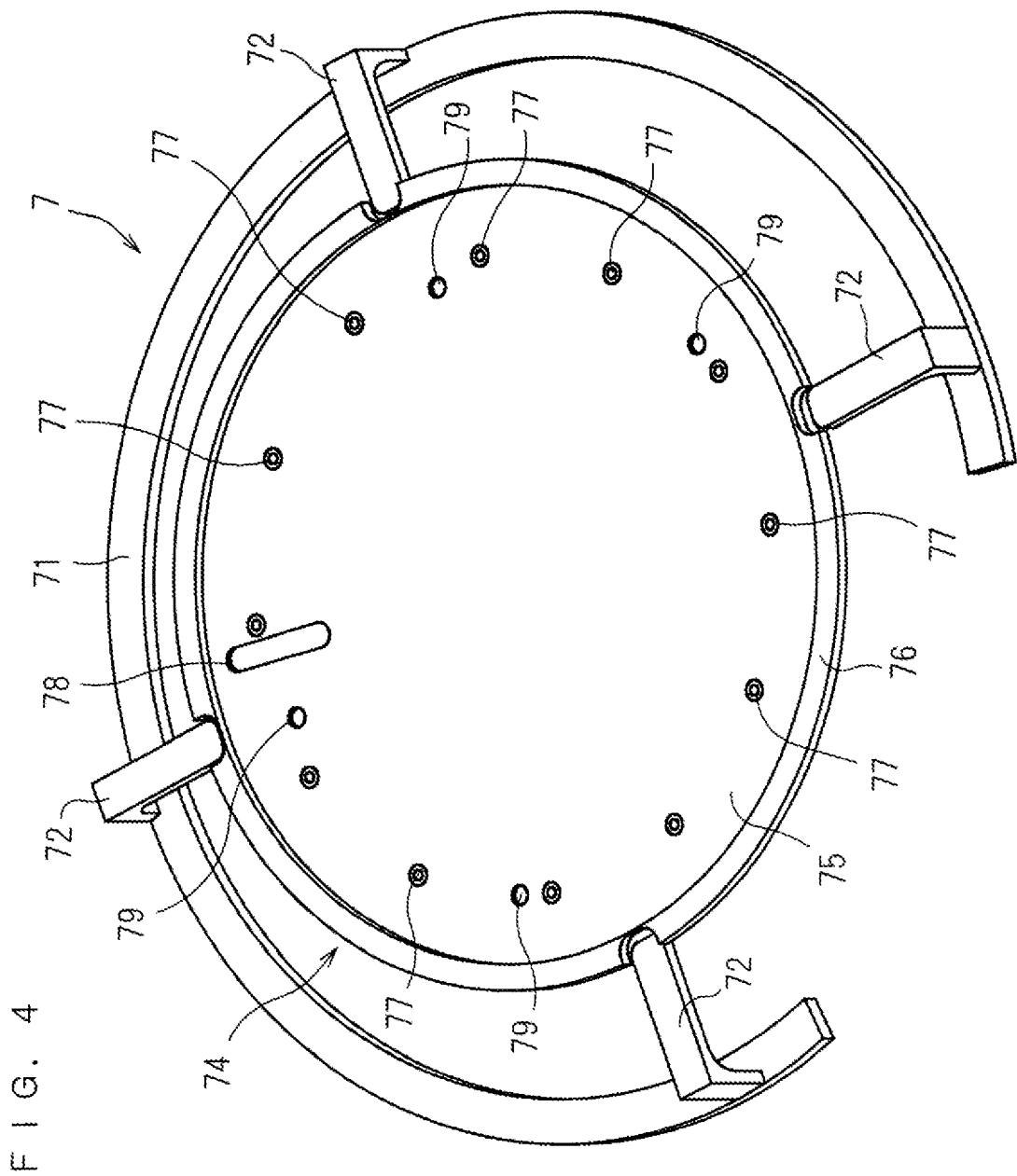
FIG. 4 is a perspective view illustrating appearance of a holding unit as a whole.

FIG. 4 is a perspective view illustrating appearance of the holding unit 7 as a whole. The holding unit 7 includes a base ring 71, connectors 72, and the susceptor 74. The base ring 71, the connectors 72, and the susceptor 74 are each made of quartz. That is to say, the holding unit 7 as a whole is made of quartz.

The base ring 71 is a quartz member having an arc shape that is a partially-missing annular shape. The missing portion is provided to prevent interference between transfer arms 11 of the transfer mechanism 10, which will be described below, and the base ring 71. The base ring 71 is mounted on a bottom surface of the recess 62 to be supported by a wall surface of the chamber 6 (see FIG. 3). The plurality of connectors 72 (four connectors 72 in the present embodiment) are provided to stand on an upper surface of the base ring 71 along the circumference of the annular shape thereof. The connectors 72 are also quartz members, and are fixed to the base ring 71 by welding.

Figure 5:
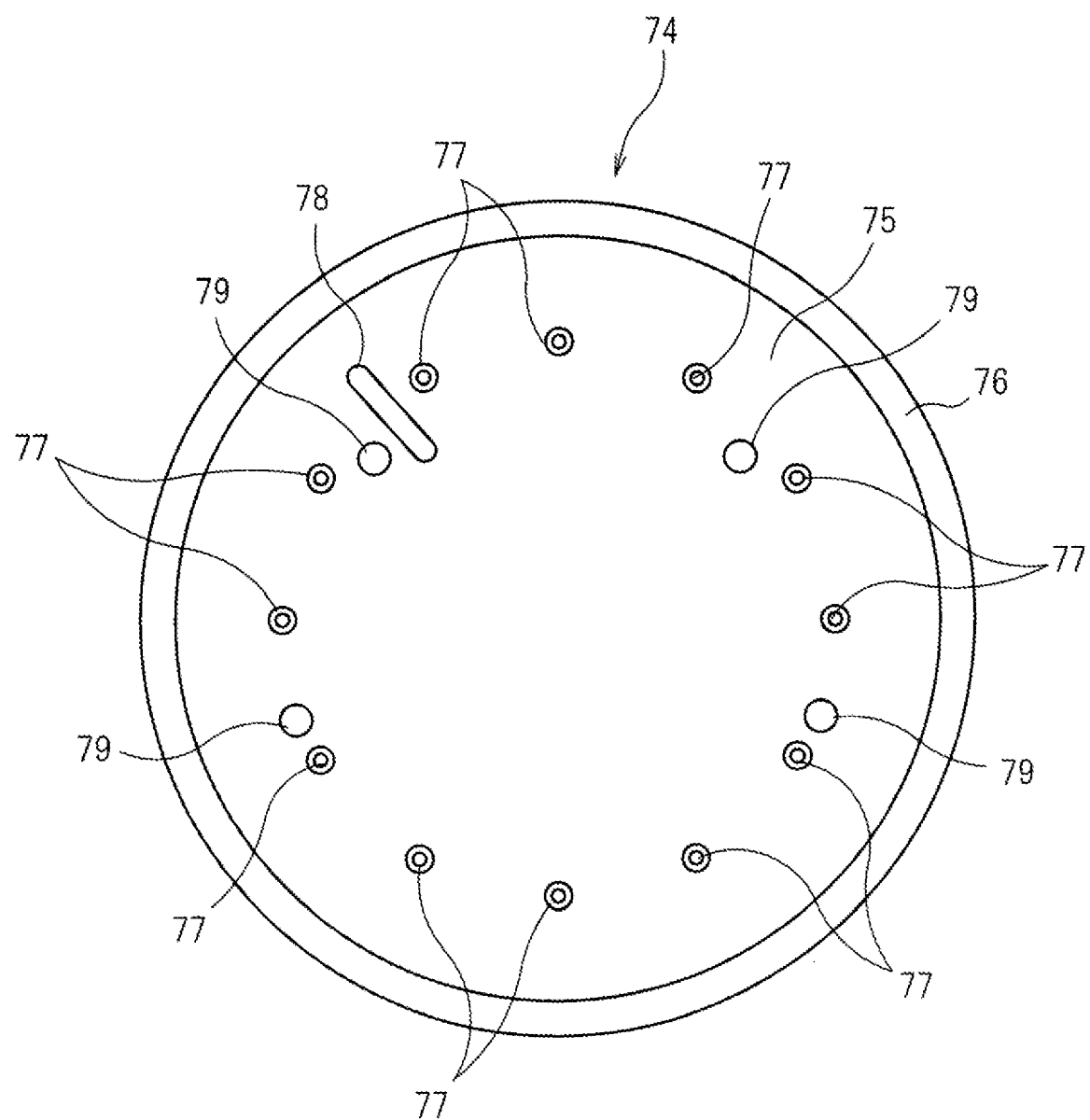
FIG. 5 is a plan view of a susceptor.
Figure 6:
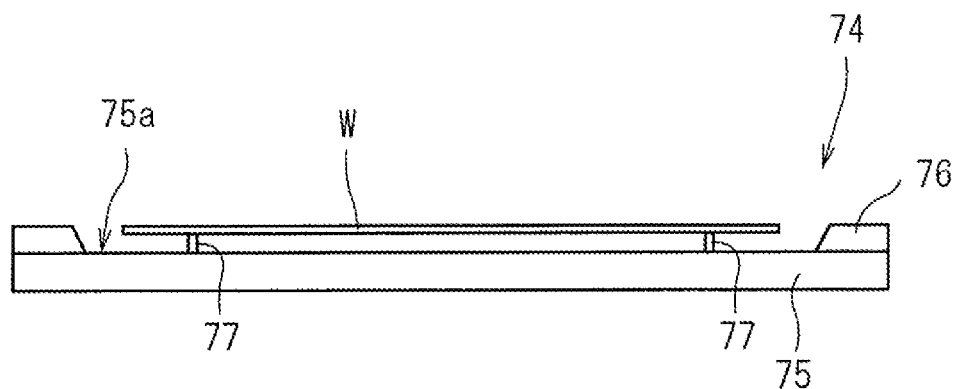
FIG. 6 is a sectional view of the susceptor.

The susceptor 74 is supported by the four connectors 72 provided on the base ring 71. FIG. 5 is a plan view of the susceptor 74. FIG. 6 is a sectional view of the susceptor 74.

The susceptor 74 includes a holding plate 75, a guide ring 76, and a plurality of substrate support pins 77. The holding plate 75 is a substantially circular planar member made of quartz. The holding plate 75 has a greater diameter than the semiconductor wafer W. That is to say, the holding plate 75 has a greater planar size than the semiconductor wafer W.

The guide ring 76 is provided at a periphery on an upper surface of the holding plate 75. The guide ring 76 is an annular member having an inner diameter greater than the diameter of the semiconductor wafer W. For example, the guide ring 76 has an inner diameter of 320 mm in a case where the semiconductor wafer W has a diameter of 300 mm.

An inner circumference of the guide ring 76 is a tapered surface widening upward from the holding plate 75. The guide ring 76 is made of quartz as with the holding plate 75.

The guide ring 76 may be welded onto the upper surface of the holding plate 75 or may be fixed to the holding plate 75 with pins and the like processed separately. Alternatively, the holding plate 75 and the guide ring 76 may be processed as an integral member.

A region of the upper surface of the holding plate 75 inside the guide ring 76 is a planar holding surface 75a for holding the semiconductor wafer W. The plurality of substrate support pins 77 are provided on the holding surface 75a of the holding plate 75. In the present embodiment, a total of 12 substrate support pins 77 are annularly provided at 30° intervals to stand on a circumference of a circle concentric with an outer circumference of the holding surface 75a (the inner circumference of the guide ring 76).

The diameter of the circle on which the 12 substrate support pins 77 are arranged (the distance between opposite substrate support pins 77) is smaller than the diameter of the semiconductor wafer W, and is 210 mm to 280 mm if the semiconductor wafer W has a diameter of 300 mm. The number of substrate support pins 77 is three or more. The substrate support pins 77 are each made of quartz.

The plurality of substrate support pins 77 may be provided on the upper surface of the holding plate 75 by welding, or may processed to be integral with the holding plate 75.

Referring back to FIG. 4, the four connectors 72 provided to stand on the base ring 71 and the periphery of the holding plate 75 of the susceptor 74 are fixed to each other by welding. That is to say, the susceptor 74 and the base ring 71 are fixedly connected to each other by the connectors 72. The base ring 71 of the holding unit 7 as described above is supported by the wall surface of the chamber 6, so that the holding unit 7 is attached to the chamber 6. When the holding unit 7 is in a state of being attached to the chamber 6, the holding plate 75 of the susceptor 74 is in the horizontal position (in a position in which a normal thereto is coincident with the vertical direction). That is to say, the holding surface 75a of the holding plate 75 is a horizontal surface.

The semiconductor wafer W transported to the chamber 6 is mounted on the susceptor 74 of the holding unit 7 attached to the chamber 6, and is held in the horizontal position. In this case, the semiconductor wafer W is supported by the 12 substrate support pins 77 provided to stand on the holding plate 75 to be held by the susceptor 74. More strictly, upper ends of the 12 substrate support pins 77 are in contact with the lower surface of the semiconductor wafer W to support the semiconductor wafer W.

The 12 substrate support pins 77 have a uniform height (a uniform distance from the upper ends of the substrate support pins 77 to the holding surface 75a of the holding plate 75), and thus can support the semiconductor wafer W in the horizontal position.

The semiconductor wafer W is supported by the plurality of substrate support pins 77 to be spaced apart from the holding surface 75a of the holding plate 75 by a predetermined distance. The thickness of the guide ring 76 is greater than the height of each of the substrate support pins 77. Misalignment in the horizontal direction of the semiconductor wafer W supported by the plurality of substrate support pins 77 is thus prevented by the guide ring 76.

As illustrated in FIGS. 4 and 5, the holding plate 75 of the susceptor 74 has an opening 78 formed through the holding plate 75. The opening 78 is provided for the lower radiation thermometer 20 to receive light (infrared light) radiated from the lower surface of the semiconductor wafer W. That is to say, the lower radiation thermometer 20 receives light radiated from the lower surface of the semiconductor wafer W through the opening 78 and the transparent window 21 attached to the through hole 61b of the chamber side portion 61, and measures the temperature of the semiconductor wafer W.

The holding plate 75 of the susceptor 74 further has four through holes 79 through which lift pins 12 of the transfer mechanism 10, which will be described below, are to penetrate for a transfer of the semiconductor wafer W.

Figure 7:
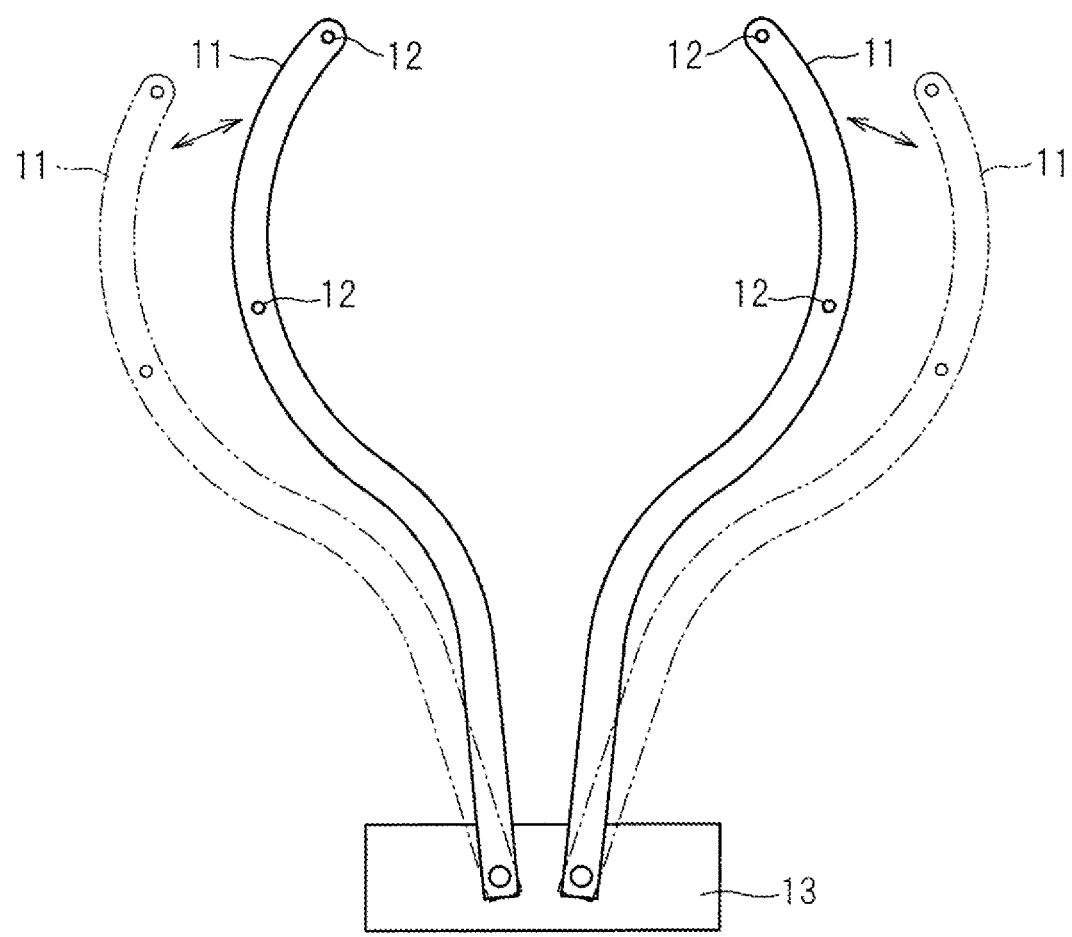
FIG. 7 is a plan view of a transfer mechanism.
Figure 8:
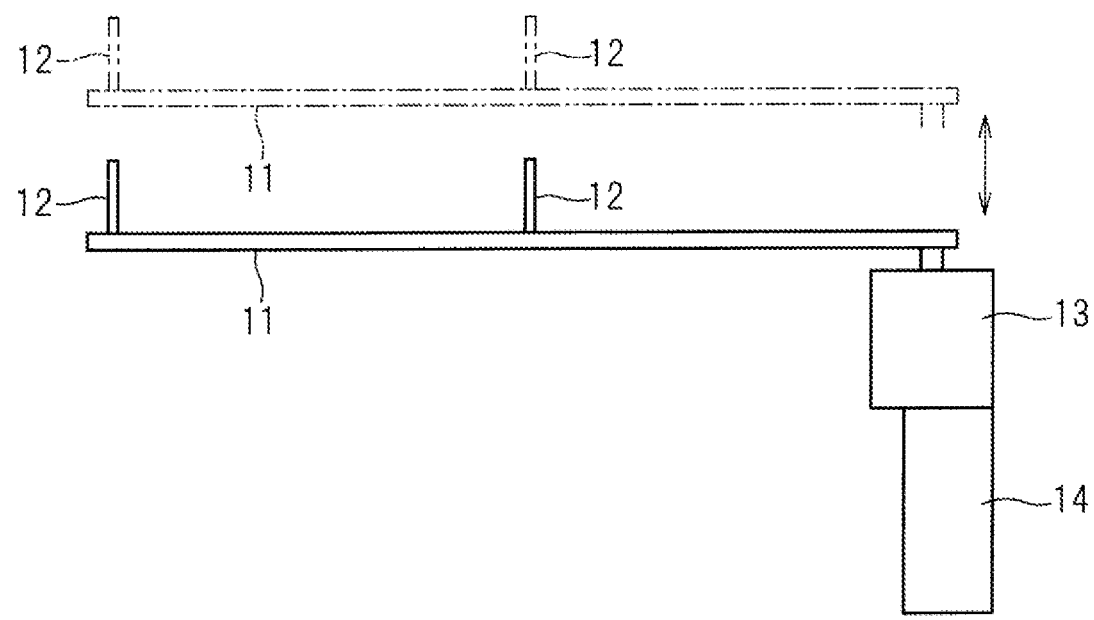
FIG. 8 is a side view of the transfer mechanism.

FIG. 7 is a plan view of the transfer mechanism 10. FIG. 8 is a side view of the transfer mechanism 10. The transfer mechanism 10 includes two transfer arms 11. The transfer arms 11 have an arc shape substantially along the recess 62 formed to be annular.

Two lift pins 12 are provided to stand on each of the transfer arms 11. The transfer arms 11 and the lift pins 12 are each made of quartz. The transfer arms 11 are each rotatable by a horizontal movement mechanism 13. The horizontal movement mechanism 13 horizontally moves the pair of transfer arms 11 between a transfer operation location (a location in solid lines in FIG. 7) where the semiconductor wafer W is transferred to and from the holding unit 7 and a withdrawal location (a location in alternate long and two short dashes lines in FIG. 7) where the pair of transfer arms 11 does not overlap the semiconductor wafer W held by the holding unit 7 in plan view.

The horizontal movement mechanism 13 may rotate the transfer arms 11 by separate motors, or may rotate the transfer arms 11 in conjunction with each other by a single motor using a link mechanism.

The pair of transfer arms 11 is moved upward and downward by an upward and downward mechanism 14 along with the horizontal movement mechanism 13. When the upward and downward mechanism 14 moves the pair of transfer arms 11 upward at the transfer operation location, a total of four lift pins 12 pass through the through holes 79 (see FIGS. 4 and 5) formed in the susceptor 74, and upper ends of the lift pins 12 protrude from the upper surface of the susceptor 74. On the other hand, when the upward and downward mechanism 14 moves the pair of transfer arms 11 downward at the transfer operation location to draw the lift pins 12 from the through holes 79, and the horizontal movement mechanism 13 moves the pair of transfer arms 11 to open the transfer arms 11, the transfer arms 11 are moved to the withdrawal location.

The withdrawal location of the pair of transfer arms 11 is immediately above the base ring 71 of the holding unit 7. The base ring 71 is mounted on the bottom surface of the recess 62, so that the withdrawal location of the transfer arms 11 is inside the recess 62. An exhaust mechanism, which is not illustrated, is provided near a location where a drive unit (the horizontal movement mechanism 13 and the upward and downward mechanism 14) of the transfer mechanism 10 is provided to exhaust an atmosphere around the drive unit of the transfer mechanism 10 to the outside of the chamber 6.

Referring back to FIG. 3, the flash heating unit 5 provided above the chamber 6 includes, within a housing 51, a light source composed of the plurality of flash lamps FL (30 flash lamps FL in the present embodiment) and a reflector 52 provided to cover the light source from above.

A lamp light radiation window 53 is attached to the bottom of the housing 51 of the flash heating unit 5. The lamp light radiation window 53 forming a floor of the flash heating unit 5 is a plate-like quartz window made of quartz. The flash heating unit 5 is installed above the chamber 6, so that the lamp light radiation window 53 opposes the upper chamber window 63.

The flash lamps FL irradiate the thermal processing space 65 with flash light from above the chamber 6 through the lamp light radiation window 53 and the upper chamber window 63.

The plurality of flash lamps FL are each a rod-like lamp having an elongated cylindrical shape, and are in planar arrangement so that longitudinal directions thereof are parallel to each other along the main surface of the semiconductor wafer W held by the holding unit 7 (i.e., along the horizontal direction). A planar surface formed by arrangement of the flash lamps FL is thus a horizontal surface.

Each of the flash lamps FL includes a rod-like glass tube (discharge tube) in which xenon gas is enclosed and which has, at opposite ends thereof, an anode and a cathode connected to a capacitor, and a trigger electrode attached to an outer circumferential surface of the glass tube.

Xenon gas is electrically an insulator, so that electricity does not flow through the glass tube in a normal state even if electric charge is accumulated in the capacitor. In a case where a high voltage is applied to the trigger electrode to cause electrical breakdown, however, electricity stored in the capacitor instantaneously flows through the glass tube, and light is emitted by excitation of atoms or molecules of xenon at the time. In such a flash lamp FL, electrostatic energy stored in advance in the capacitor is converted into an extremely short light pulse of 0.1 ms to 100 ms. The flash lamp FL thus has a feature of being capable of emitting extremely intense light compared with a continuously lighting light source, such as a halogen lamp HL. That is to say, the flash lamp FL is a pulsed light emitting lamp momentarily emitting light in an extremely short time of less than one second.

A light emitting time of the flash lamp FL can be adjusted by a coil constant of a lamp power supply supplying power to the flash lamp FL.

The reflector 52 is provided above the plurality of flash lamps FL to cover the flash lamps FL as a whole. A basic function of the reflector 52 is to reflect flash light emitted from the plurality of flash lamps FL toward the thermal processing space 65. The reflector 52 is formed of an aluminum alloy plate, and has a front surface (a surface facing the flash lamps FL, that is, an upper surface) having been roughened by blasting.

The halogen heating unit 4 provided below the chamber 6 incorporates the plurality of halogen lamps HL (40 halogen lamps HL in the present embodiment) in a housing 41. The halogen heating unit 4 irradiates the thermal processing space 65 with light from below the chamber 6 through the lower chamber window 64 using the plurality of halogen lamps HL to heat the semiconductor wafer W.

Figure 9:
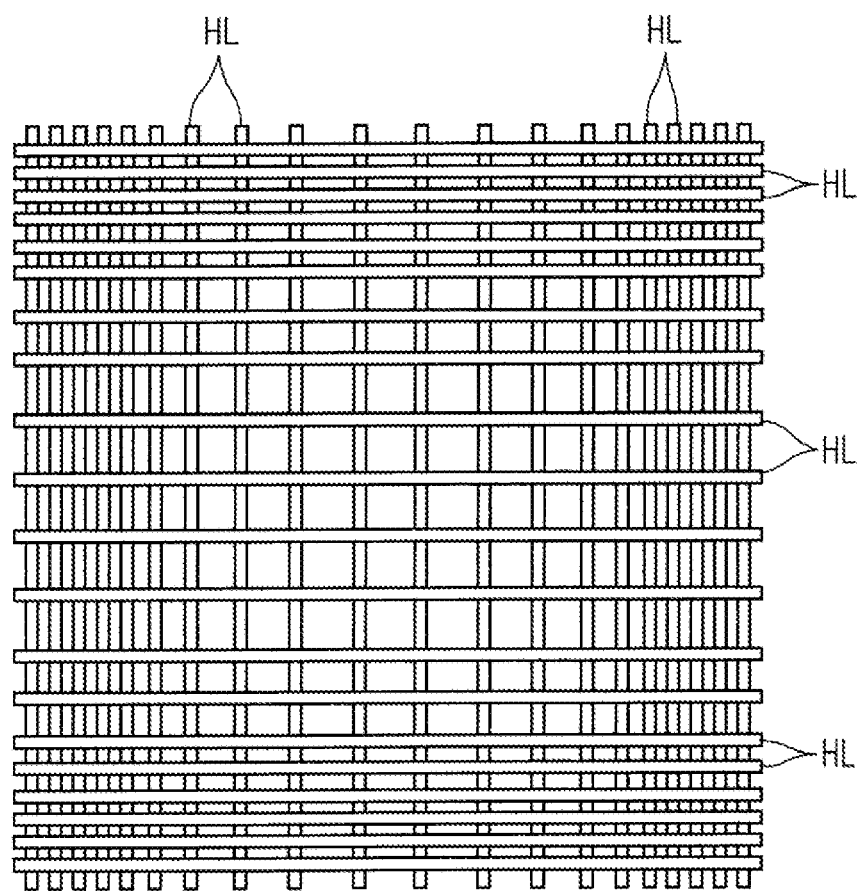
FIG. 9 is a plan view illustrating arrangement of a plurality of halogen lamps.

FIG. 9 is a plan view illustrating arrangement of the plurality of halogen lamps HL. The 40 halogen lamps HL are separately arranged on two levels. On a higher level closer to the holding unit 7, 20 halogen lamps HL are arranged, and, on a lower level farther from the holding unit 7 than the higher level is, 20 halogen lamps HL are arranged.

The halogen lamps HL are each a rod-like lamp having an elongated cylindrical shape. The 20 halogen lamps HL on each of the higher and lower levels are arranged so that longitudinal directions thereof are parallel to each along the main surface of the semiconductor wafer W held by the holding unit 7 (i.e., along the horizontal direction). A planar surface formed by arrangement of the halogen lamps HL on each of the higher and lower levels is thus a horizontal surface.

As illustrated in FIG. 9, the halogen lamps HL arranged on each of the higher and lower levels are denser in a region opposing the periphery of the semiconductor wafer W held by the holding unit 7 than in a region opposing a central portion of the semiconductor wafer W held by the holding unit 7. That is to say, the halogen lamps HL arranged on each of the higher and lower levels have a shorter pitch at the periphery than in a central portion of arrangement of the lamps. The periphery of the semiconductor wafer W where a decrease in temperature is likely to occur at heating by irradiation with light from the halogen heating unit 4 can thus be irradiated with a greater amount of light.

The halogen lamps HL are arranged so that the halogen lamps HL on the higher level and the halogen lamps HL on the lower level intersect with each other in a grid. That is to say, a total of 40 halogen lamps HL are arranged so that longitudinal directions of the 20 halogen lamps HL arranged on the higher level and longitudinal directions of the 20 halogen lamps HL arranged on the lower level are orthogonal to each other.

Each of the halogen lamps HL is a filament light source causing a filament disposed inside a glass tube to glow by allowing current to pass therethrough to thereby emit light. Gas obtained by introducing traces of halogen elements (e.g., iodide and bromine) into inert gas, such as nitrogen and argon, is enclosed in the glass tube. Introduction of halogen elements allows for setting the temperature of the filament to a high temperature while suppressing breakage of the filament.

The halogen lamp HL thus has a property of having a longer life and being capable of continuously emitting intense light compared with a typical incandescent lamp. That is to say, the halogen lamp HL is a continuous lighting lamp continuously emitting light for at least one second or more. The halogen lamps HL have long lives as they are rod-like lamps, and have excellent radiation efficiency toward the semiconductor wafer W above the halogen lamps HL by being arranged along the horizontal direction.

In the housing 41 of the halogen heating unit 4, a reflector 43 is also provided below the halogen lamps HL arranged on the two levels (FIG. 3). The reflector 43 reflects light emitted from the plurality of halogen lamps HL toward the thermal processing space 65.

As illustrated in FIG. 3, two radiation thermometers (pyrometers in the present embodiment), namely, the upper radiation thermometer 25 and the lower radiation thermometer 20, are provided in the chamber 6. The upper radiation thermometer 25 is provided obliquely above the semiconductor wafer W held by the susceptor 74, and the lower radiation thermometer 20 is provided obliquely below the semiconductor wafer W held by the susceptor 74.

Figure 10:
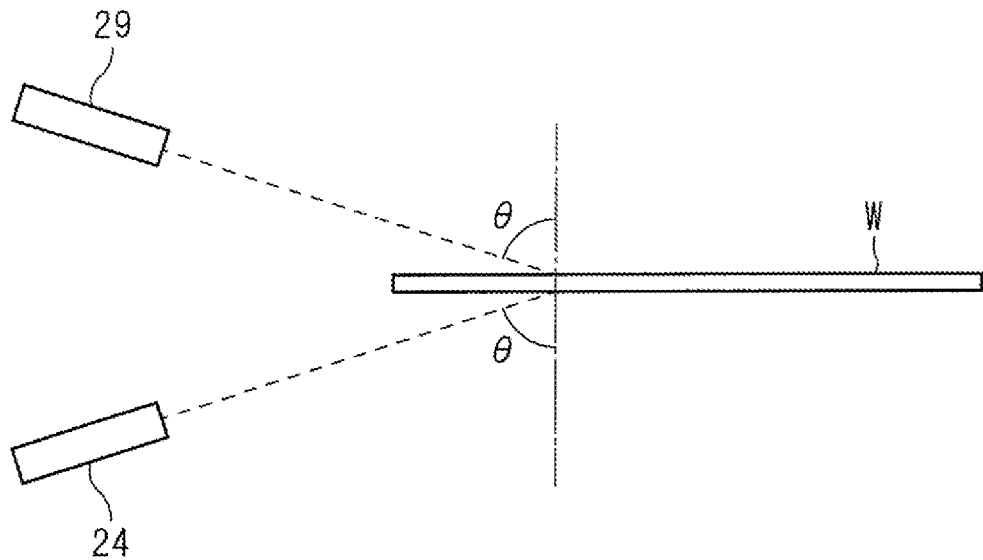
FIG. 10 illustrates a positional relationship between a lower radiation thermometer and a semiconductor wafer held by the susceptor.

FIG. 10 illustrates a positional relationship between the lower radiation thermometer 20 and the semiconductor wafer W held by the susceptor 74.

The infrared sensor 24 of the lower radiation thermometer 20 has an acceptance angle $\theta$ for the semiconductor wafer W of 60° or more and 89° or less. The acceptance angle $\theta$ is an angle formed by an optical axis of the infrared sensor 24 of the lower radiation thermometer 20 and a normal to (a vertical line with respect to the main surface of) the semiconductor wafer W. The infrared sensor 29 of the upper radiation thermometer 25 also has an acceptance angle $\theta$ for the semiconductor wafer W of 60° or more and 89° or less. The acceptance angle of the infrared sensor 24 of the lower radiation thermometer 20 for the semiconductor wafer W and the acceptance angle of the infrared sensor 29 of the upper radiation thermometer 25 for the semiconductor wafer W may not be equal to each other.

The controller 3 controls the above-mentioned various operation mechanisms provided in the thermal processing unit 160. The controller 3 has a similar hardware configuration to a typical computer. That is to say, the controller 3 includes a CPU as a circuit to perform various types of arithmetic processing, ROM as read-only memory for storing a basic program, RAM as read/write memory for storing various pieces of information, and a magnetic disk for storing control software, data, and the like. The CPU of the controller 3 executes a predetermined processing program to proceed with processing performed by the thermal processing unit 160.

Figure 11:
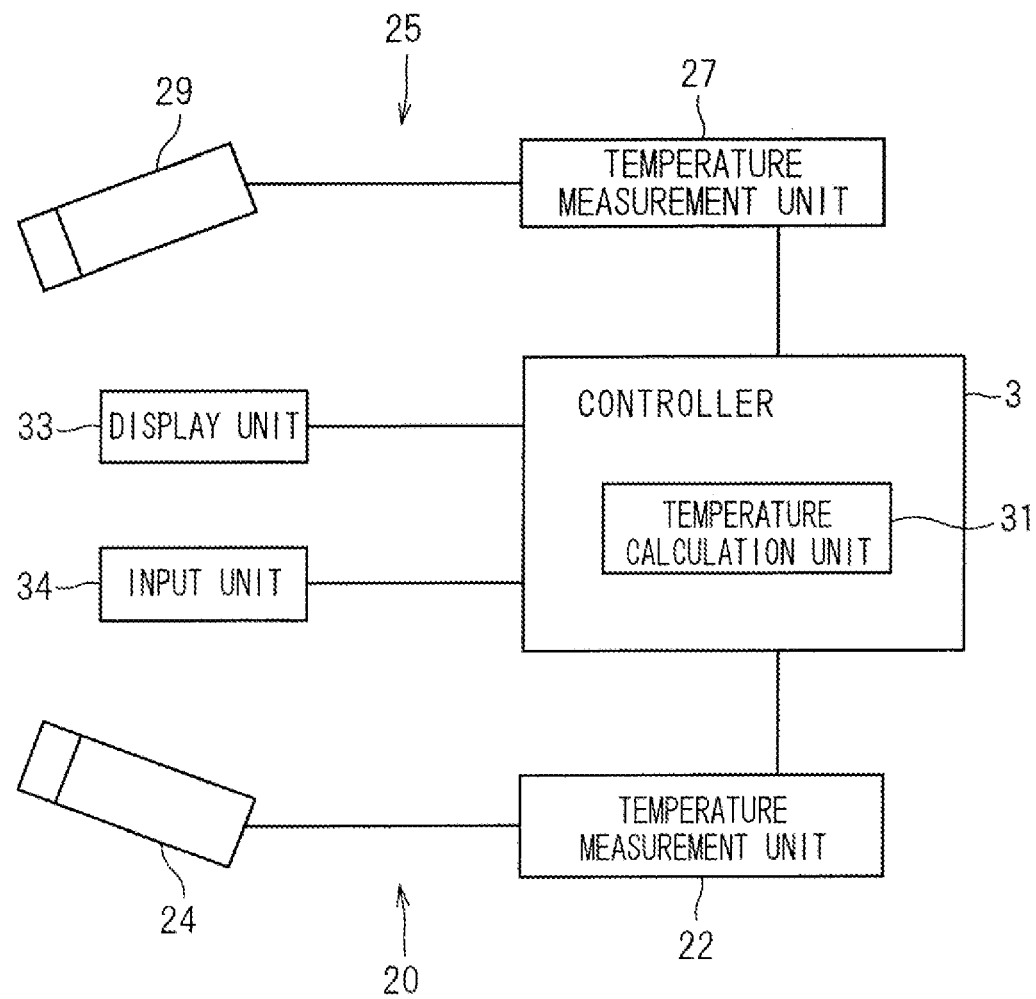
FIG. 11 is a functional block diagram showing the relationship among the lower radiation thermometer, an upper radiation thermometer, and a controller.

FIG. 11 is a functional block diagram showing the relationship among the lower radiation thermometer 20, the upper radiation thermometer 25, and the controller 3.

The lower radiation thermometer 20 provided obliquely below the semiconductor wafer W and measuring the temperature on the lower surface of the semiconductor wafer W includes the infrared sensor 24 and a temperature measurement unit 22.

The infrared sensor 24 receives infrared light radiated from the lower surface of the semiconductor wafer W held by the susceptor 74 through the opening 78 The infrared sensor 24 is electrically connected to the temperature measurement unit 22, and transmits a signal generated in response to reception of light to the temperature measurement unit 22.

The temperature measurement unit 22 includes an amplifying circuit, an A/D convertor, a temperature conversion circuit, and the like, which are not illustrated, and converts the signal indicating intensity of infrared light output from the infrared sensor 24 into the temperature. The temperature acquired by the temperature measurement unit 22 is the temperature on the lower surface of the semiconductor wafer W.

On the other hand, the upper radiation thermometer 25 provided obliquely above the semiconductor wafer W and measuring the temperature on the upper surface of the semiconductor wafer W includes the infrared sensor 29 and a temperature measurement unit 27. The infrared sensor 29 receives infrared light radiated from the upper surface of the semiconductor wafer W held by the susceptor 74. The infrared sensor 29 includes an optical device made of InSb (indium antimonide) to response to a rapid change in temperature on the upper surface of the semiconductor wafer W at the moment when the upper surface is irradiated with flash light. The infrared sensor 29 is electrically connected to the temperature measurement unit 27, and transmits a signal generated in response to reception of light to the temperature measurement unit 27. The temperature measurement unit 27 converts the signal indicating intensity of infrared light output from the infrared sensor 29 into the temperature. The temperature acquired by the temperature measurement unit 27 is the temperature on the upper surface of the semiconductor wafer W.

The lower radiation thermometer 20 and the upper radiation thermometer 25 are electrically connected to the controller 3 as a controller for the thermal processing unit 160 as a whole, and the temperature on the lower surface and the upper surface of the semiconductor wafer W respectively measured by the lower radiation thermometer 20 and the upper radiation thermometer 25 are transmitted to the controller 3.

The controller 3 includes a temperature calculation unit 31. The temperature calculation unit 31 is a functional processing unit achieved by the CPU of the controller 3 executing the predetermined processing program. Details of processing performed by the temperature calculation unit 31 will further be described below.

A display unit 33 and an input unit 34 are connected to the controller 3. The controller 3 causes the display unit 33 to display various pieces of information. The input unit 34 is equipment for an operator of the thermal processing apparatus 100 to input various commands or parameters to the controller 3. The operator can set, through the input unit 34, conditions for a processing recipe in which procedures of and conditions for processing of the semiconductor wafer W are described while checking display content of the display unit 33.

As the display unit 33 and the input unit 34, a touch panel having functions of both of them can be used, and a liquid crystal touch panel provided on an outer wall of the thermal processing apparatus 100 is used in the present embodiment.

In addition to the above-mentioned components, the thermal processing apparatus 100 includes various structure for cooling to prevent an excessive increase in temperature of the halogen heating unit 4, the flash heating unit 5, and the chamber 6 caused by thermal energy generated by the halogen lamps HL and the flash lamps FL at thermal processing of the semiconductor wafer W.

For example, a water-cooled tube (not illustrated) is provided in a wall body of the chamber 6. The halogen heating unit 4 and the flash heating unit 5 each have an air-cooled structure in which a gas flow is formed to exhaust heat. Air is supplied to a gap between the upper chamber window 63 and the lamp light radiation window 53 to cool the flash heating unit 5 and the upper chamber window 63.

<Operation of Thermal Processing Apparatus>

Procedures of processing of the semiconductor wafer W performed by the thermal processing apparatus 100 will be described next. FIG. 12 is a flowchart showing procedures of processing of the semiconductor wafer W. The controller 3 controls each of the operation mechanisms of the thermal processing apparatus 100 to proceed with procedures of processing performed by the thermal processing apparatus 100 described below.

First, the valve 84 for supplying gas is opened, and the valve 89 and the valve 192 for exhausting gas are opened to start supply and exhaust of gas to and from the chamber 6. When the valve 84 is opened, nitrogen gas is supplied through the gas supply hole 81 to the thermal processing space 65. When the valve 89 is opened, gas in the chamber 6 is exhausted from the gas exhaust hole 86. Nitrogen gas supplied from an upper portion of the thermal processing space 65 in the chamber 6 thereby flows downward, and is exhausted from a lower portion of the thermal processing space 65.

Gas in the chamber 6 is also exhausted from the transport opening 66 by opening the valve 192. Furthermore, the atmosphere around the drive unit of the transfer mechanism 10 is exhausted by the exhaust mechanism, which is not illustrated. When the thermal processing apparatus 100 performs thermal processing on the semiconductor wafer W, nitrogen gas is continuously supplied to the thermal processing space 65, and the amount of supply is changed as appropriate in accordance with a step of processing.

Then, the gate valve 185 is opened to open the transport opening 66, and the transport robot outside the apparatus transports the semiconductor wafer W to be processed to the thermal processing space 65 in the chamber 6 through the transport opening 66 (step S1). In this case, an atmosphere outside the apparatus can be entrained by transportation of the semiconductor wafer W, but, since nitrogen gas is continued to be supplied to the chamber 6, nitrogen gas flows out from the transport opening 66 to minimize such entrainment of the atmosphere outside the apparatus.

The semiconductor wafer W transported by the transport robot is moved to a location immediately above the holding unit 7, and is stopped. The pair of transfer arms 11 of the transfer mechanism 10 horizontally moves from the withdrawal location to the transfer operation location, and moves upward, so that the lift pins 12 pass through the through holes 79 to protrude from the upper surface of the holding plate 75 of the susceptor 74, and receive the semiconductor wafer W. In this case, the lift pins 12 are moved above the upper ends of the substrate support pins 77.

After the semiconductor wafer W is mounted on the lift pins 12, the transport robot leaves the thermal processing space 65, and the transport opening 66 is closed by the gate valve 185. The pair of transfer arms 11 moves downward, so that the semiconductor wafer W is transferred from the transfer mechanism 10 to the susceptor 74 of the holding unit 7, and is held in the horizontal position from below. The semiconductor wafer W is held by the susceptor 74 by being supported by the plurality of substrate support pins 77 provided to stand on the holding plate 75. The semiconductor wafer W is held by the holding unit 7 with a front surface as an objective surface facing upward. There is a predetermined distance between a back surface (a main surface opposing the front surface) of the semiconductor wafer W supported by the plurality of substrate support pins 77 and the holding surface 75a of the holding plate 75. The pair of transfer arms 11 having moved downward to a location below the susceptor 74 is withdrawn by the horizontal movement mechanism 13 to the withdrawal location, that is, a location inside the recess 62.

FIG. 13 shows a change in temperature on the front surface of the semiconductor wafer W. After the semiconductor wafer W is transported to the chamber 6 and held by the susceptor 74, the 40 halogen lamps HL of the halogen heating unit 4 are simultaneously turned on at time t1 to start preheating (assist heating) (step S2). Halogen light emitted from the halogen lamps HL is transmitted by the lower chamber window 64 and the susceptor 74 each made of quartz, and is applied to the lower surface of the semiconductor wafer W. By being irradiated with light from the halogen lamps HL, the semiconductor wafer W is preheated to have an increased temperature. The transfer arms 11 of the transfer mechanism 10 are withdrawn to the inside of the recess 62, and thus do not interfere with heating by the halogen lamps HL.

The temperature of the semiconductor wafer W increased by irradiation with light from the halogen lamps HL is measured by the lower radiation thermometer 20. That is to say, the lower radiation thermometer 20 receives, through the transparent window 21, infrared light radiated from the lower surface (back surface) of the semiconductor wafer W held by the susceptor 74 through the opening 78, and measures the temperature on the back surface of the semiconductor wafer W (step S3). The lower radiation thermometer 20 may start measurement of the temperature before the start of preheating by the halogen lamps HL.

In many cases, various films according to the object of processing are formed on the semiconductor wafer W. For example, a resist film for a photomask, an interlayer dielectric, a high-dielectric film, and the like are sometimes formed on the semiconductor wafer W. These films are typically formed on the front surface (objective surface) of the semiconductor wafer W, but, with recent complication of the process of manufacturing the semiconductor device, any film can be formed on the back surface of the semiconductor wafer W. The semiconductor wafer W having the back surface on which the film has been formed is to be thermally processed by the thermal processing apparatus 100.

When the lower radiation thermometer 20 contactlessly measures the temperature on the back surface of the semiconductor wafer W, emissivity of the back surface is required to be set to the lower radiation thermometer 20. If no film is formed on the back surface of the semiconductor wafer W, emissivity of silicon as a base material for the wafer should be set to the lower radiation thermometer 20. If any film is formed on the back surface of the semiconductor wafer W, however, emissivity of the back surface is changed by the film.

The temperature on the back surface of the semiconductor wafer W measured by the lower radiation thermometer 20 is transmitted to the controller 3. The controller 3 controls output of the halogen lamps HL while monitoring the temperature of the semiconductor wafer W increased by irradiation with light from the halogen lamps HL to determine whether it has reached a predetermined preheat temperature T1. That is to say, the controller 3 performs feedback control of output of the halogen lamps HL based on a value measured by the lower radiation thermometer 20 so that the temperature of the semiconductor wafer W becomes the preheat temperature T1. As described above, the lower radiation thermometer 20 is a temperature sensor for controlling output of the halogen lamps HL at a preheating stage. The lower radiation thermometer 20 measures the temperature on the back surface of the semiconductor wafer W. At the stage of preheating by the halogen lamps HL, however, there is no difference in temperature between the front and back surfaces of the semiconductor wafer W, and the temperature on the back surface measured by the lower radiation thermometer 20 can be considered as the temperature of the semiconductor wafer W as a whole.

After the temperature of the semiconductor wafer W has reached the preheat temperature T1, the controller 3 maintains the semiconductor wafer W at the preheat temperature T1 for a while. Specifically, at time t2 when the temperature of the semiconductor wafer W measured by the lower radiation thermometer 20 reaches the preheat temperature T1, the controller 3 adjusts output of the halogen lamps HL to maintain the semiconductor wafer W substantially at the preheat temperature T1.

The temperature of the semiconductor wafer W as a whole is uniformly increased to the preheat temperature T1 through preheating by the halogen lamps HL as described above. At the stage of preheating by the halogen lamps HL, the temperature at the periphery of the semiconductor wafer W where heat is more likely to be dissipated tends to be lower than the temperature in the central portion of the semiconductor wafer W, but the halogen lamps HL of the halogen heating unit 4 are denser in the region opposing the periphery than in the region opposing the central portion of the semiconductor wafer W. The periphery of the semiconductor wafer W where heat is more likely to be dissipated can thus be irradiated with a greater amount of light to make in-plane temperature distribution of the semiconductor wafer W uniform at the preheating stage.

At time t3 when a predetermined time has elapsed since reaching of the temperature of the semiconductor wafer W to the preheat temperature T1, the flash lamps FL of the flash heating unit 5 irradiate the front surface of the semiconductor wafer W held by the susceptor 74 with flash light (step S4). In this case, part of flash light radiated from the flash lamps FL is directly directed toward the inside of the chamber 6, the other part of flash light radiated from the flash lamps FL is once reflected by reflector 52 and is then directed toward the inside of the chamber 6, and thus the semiconductor wafer W is flash heated by irradiation with such flash light.

The semiconductor wafer W is flash heated by irradiation with flash light from the flash lamps FL, and thus the temperature on the front surface of the semiconductor wafer W can be increased in a short time. That is to say, flash light emitted from the flash lamps FL is intense flash light having an extremely short irradiation time of approximately 0.1 ms or more and 100 ms or less obtained by converting electrostatic energy stored in advance in the capacitor into an extremely short light pulse. The temperature on the front surface of the semiconductor wafer W is rapidly increased in an extremely short time by irradiation with flash light from the flash lamps FL.

The temperature on the front surface of the semiconductor wafer W is monitored by the upper radiation thermometer 25. The upper radiation thermometer 25, however, does not measure an absolute temperature on the front surface of the semiconductor wafer W but measures a change in temperature on the front surface. That is to say, the upper radiation thermometer 25 measures an increased temperature (a jump temperature) ΔT by which the temperature on the front surface of the semiconductor wafer W is increased from the preheat temperature T1 at irradiation with flash light (step S5). Although the temperature on the back surface of the semiconductor wafer W is measured by the lower radiation thermometer 20 also at irradiation with flash light, only the portion near the front surface of the semiconductor wafer W is rapidly heated when the semiconductor wafer W is irradiated with flash light that is intense and has an extremely short irradiation time, a difference in temperature is caused between the front and back surfaces of the semiconductor wafer W, and the temperature on the front surface of the semiconductor wafer W cannot be measured by the lower radiation thermometer 20. The upper radiation thermometer 25 has an acceptance angle for the semiconductor wafer W of 60° or more and 89° or less as with the lower radiation thermometer 20, and thus can measure the increased temperature ΔT on the front surface of the semiconductor wafer W with accuracy regardless of a type of a film formed on the front surface of the semiconductor wafer W.

Next, the temperature calculation unit 31 of the controller 3 calculates a maximum temperature to which the temperature on the front surface of the semiconductor wafer W has reached at irradiation with flash light (step S6). The temperature on the back surface of the semiconductor wafer W is continuously measured by the lower radiation thermometer 20 at least from the time t2 when the temperature of the semiconductor wafer W reaches a certain temperature at preheating to the time t3 when the semiconductor wafer W is irradiated with flash light. At the preheating stage before irradiation with flash light, there is no difference in temperature between the front and back surfaces of the semiconductor wafer W, and the temperature on the back surface of the semiconductor wafer W measured by the lower radiation thermometer 20 before irradiation with flash light is also the temperature of the front surface. The temperature calculation unit 31 calculates a maximum reached temperature T2 on the front surface by adding the increased temperature ΔT on the front surface of the semiconductor wafer W measured by the upper radiation thermometer 25 at irradiation with flash light to the temperature (preheat temperature T1) on the back surface of the semiconductor wafer W measured by the lower radiation thermometer 20 between the time t2 and the time t3 immediately before irradiation with flash light. The temperature calculation unit 31 may cause the display unit 33 to display the calculated maximum reached temperature T2.

The lower radiation thermometer 20 has a relatively large acceptance angle θ for the semiconductor wafer W of 60° or more and 89° or less, and thus can measure the temperature on the back surface of the semiconductor wafer W with accuracy regardless of a type of a film formed on the back surface of the semiconductor wafer W. The maximum reached temperature T2 on the front surface of the semiconductor wafer W at irradiation with flash light can be measured with accuracy by adding the increased temperature ΔT on the upper surface of the semiconductor wafer W measured by the upper radiation thermometer 25 to the temperature on the back surface (=the temperature on the front surface) of the semiconductor wafer W measured with accuracy by the lower radiation thermometer 20.

The halogen lamps HL are turned off at time t4 when a predetermined time has elapsed since the end of irradiation with flash light. The temperature of the semiconductor wafer W thereby rapidly decreases from the preheat temperature T1. The temperature of the semiconductor wafer W during the decrease is measured by the lower radiation thermometer 20, and a result of measurement is transmitted to the controller 3. The controller 3 monitors the result of measurement by the lower radiation thermometer 20 to determine whether the temperature of the semiconductor wafer W has decreased to a predetermined temperature. After the temperature of the semiconductor wafer W has decreased to the predetermined temperature or less, the pair of transfer arms 11 of the transfer mechanism 10 horizontally moves again from the withdrawal location to the transfer operation location and moves upward, so that the lift pins 12 protrude from the upper surface of the susceptor 74 to receive the semiconductor wafer W having been thermally processed from the susceptor 74. The transport opening 66 closed by the gate valve 185 is then opened, and the semiconductor wafer W mounted on the lift pins 12 is transported from the chamber 6 by the transport robot outside the apparatus to complete heating of the semiconductor wafer W (step S7).

In the present embodiment, the lower radiation thermometer 20 is provided obliquely below the semiconductor wafer W held by the susceptor 74, and is caused to have a relatively large acceptance angle θ for the semiconductor wafer W of 60° or more and 89° or less. Dependency of emissivity of the back surface of the semiconductor wafer W on the type of the film is thus low, and the lower radiation thermometer 20 can measure the temperature on the back surface of the semiconductor wafer W with accuracy regardless of the type of the film formed on the back surface of the semiconductor wafer W.

The upper radiation thermometer 25 is provided obliquely above the semiconductor wafer W held by the susceptor 74, and is also caused to have an acceptance angle for the semiconductor wafer W of 60° or more and 89° or less. The upper radiation thermometer 25 can thus measure the increased temperature ΔT on the front surface of the semiconductor wafer W with accuracy regardless of the type of the film formed on the front surface of the semiconductor wafer W.

The lower radiation thermometer 20 measures the temperature on the back surface of the semiconductor wafer W between the time t2 and the time t3 immediately before irradiation with flash light. At irradiation with flash light, the upper radiation thermometer 25 measures the increased temperature ΔT on the front surface of the semiconductor wafer W. The temperature on the front surface of the semiconductor wafer W at irradiation with flash light can be measured with accuracy by adding the increased temperature ΔT on the upper surface of the semiconductor wafer W measured by the upper radiation thermometer 25 to the temperature on the back surface of the semiconductor wafer W measured with accuracy by the lower radiation thermometer 20.

<Arrangement Locations of Substrate Support Pins 77>

By flash lamp annealing of irradiation with flash light, the temperature on the upper surface of the semiconductor wafer W irradiated with flash light increases in a short time, and thus rapid thermal expansion occurs on the upper surface of the semiconductor wafer W. By the thermal expansion, the semiconductor wafer W is bowed so that the upper surface of the semiconductor wafer W is convex.

In a case where a space between the semiconductor wafer W and the holding plate 75 opposing the semiconductor wafer W is stretched (or compressed) by the bow of the semiconductor wafer W, it is considered that a force to cause the space to have an original volume, that is, a restoring force is generated in the space. The restoring force increases with increasing change in volume (gap volume) of the space between the semiconductor wafer W and the holding plate 75 before and after the semiconductor wafer W is bowed.

The restoring force generated by the bow of the semiconductor wafer W can displace the semiconductor wafer W supported by the substrate support pins 77, and thus concern that the semiconductor wafer W can jump from the substrate support pins 77 increases.

According to the above-mentioned premise, a jump of the semiconductor wafer W from the substrate support pins 77 can be suppressed by decreasing the restoring force by suppressing the change in gap volume before and after the semiconductor wafer W is bowed. In the present embodiment, description will be made on a substrate support device in which arrangement of the substrate support pins 77 is set so that the change in volume (gap volume) of the space between the semiconductor wafer W and the holding plate 75 is minimized before and after the semiconductor wafer W is bowed, and, more preferably, the gap volume before the semiconductor wafer W is bowed and the gap volume after the semiconductor wafer W is bowed are equal to each other.

A case where "the gap volumes are equal to each other" herein includes not only a case where the volumes are exactly equal to each other but also a case where there is a difference in volume within tolerance or to the extent that similar functions can be fulfilled.

First, the gap volume when the semiconductor wafer W is in an unbowed state is calculated. A gap volume $V_{flat}$ is expressed by an equation (1) below, where $D_{wafer}$ is the diameter of the semiconductor wafer W in the unbowed state, and $h_{pin}$ is the height of each of the substrate support pins 77 provided on the holding plate 75.

$$V_{flat} = \pi h_{pin} \left(\frac{D_{wafer}}{2}\right)^2 \tag{1}$$

Figure 14:
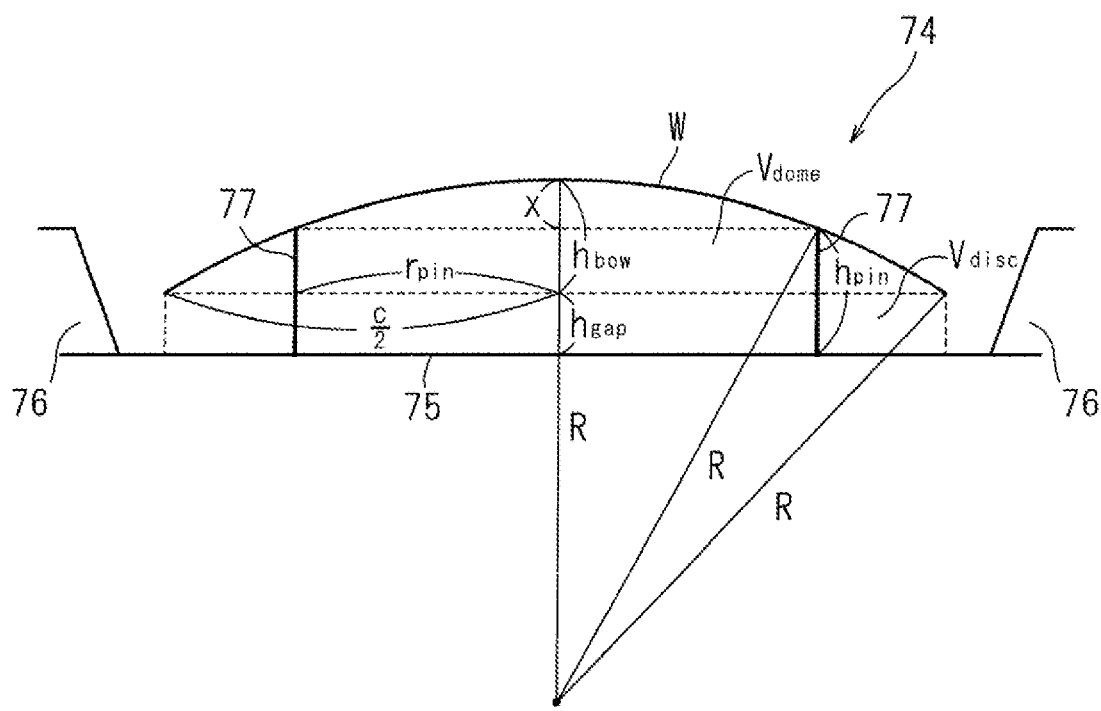
FIG. 14 shows an outline of a gap volume when the semiconductor wafer in a bowed state.

Next, the gap volume when the semiconductor wafer W is in a bowed state is calculated with reference FIG. 14. FIG. 14 herein shows an outline of the gap volume when the semiconductor wafer W is in the bowed state. As shown in FIG. 14, a gap volume $V_{total}$ when the semiconductor wafer W is in the bowed state is considered as the sum of the volume of an upper domal portion and the volume of a lower cylindrical portion. The bowed state shown in FIG. 14 is a state of the semiconductor wafer W being maximally bowed.

Given that the semiconductor wafer W is bowed (deflected) to have an ideal spherical surface, a volume $V_{dome}$ of the upper domal portion is expressed by an equation (2) below, where $h_{bow}$ is the height of the semiconductor wafer W in the bowed state (the distance, in a direction of a normal to a central portion of the semiconductor wafer W, between the apex in the central portion of the semiconductor wafer W in the bowed state and an outer periphery of the semiconductor wafer W in the bowed state), and R is a radius of curvature of the spherical surface of the semiconductor wafer W in the bowed state.

$$V_{dome} = \pi \frac{h^2_{bow}}{3}(3R - h_{bow}) \tag{2}$$

On the other hand, a volume $V_{disc}$ of the lower cylindrical portion is expressed by an equation (3) below, where $h_{gap}$ is the distance between the outer periphery of the semiconductor wafer W in the bowed state and the holding plate 75, and c is the area to be covered with the semiconductor wafer W in the bowed state in plan view.

$$V_{disc} = \pi h_{gap} \left(\frac{c}{2}\right)^2 \tag{3}$$

The relationship among $h_{gap}$, $h_{bow}$, and $h_{pin}$ is herein expressed by an equation (4) below.

$$h_{gap} + h_{bow} = h_{pin} + x \tag{4}$$

Herein, x is the distance, in the direction of the normal to the central portion of the semiconductor wafer W, between the apex in the central portion of the semiconductor wafer W in the bowed state and each of the upper ends of the substrate support pins 77.

The relationship between R and x is expressed by an equation (5) below.

$$R = k + x \tag{5}$$

An equation (6) below can thus be derived as the distance $r_{pin}$ between each of the substrate support pins 77 and the center of the semiconductor wafer W.

$$R^2 = k^2 + r^2_{pin} \tag{6}$$

An equation (7) below can be derived by substituting the equations (5) and (6) into the equation (4).

$$h_{gap} = h_{pin} - h_{bow} + R - \sqrt{R^2 - r^2_{pin}} \tag{7}$$

Furthermore, an equation (8) below can be derived by substituting the equation (7) into the equation (3).

$$V_{disc} = \pi \left(h_{pin} - h_{bow} + R - \sqrt{R^2 - r^2_{pin}}\right)\left(\frac{c}{2}\right)^2 \tag{8}$$

Given that the gap volumes are equal to each other before and after the semiconductor wafer W is bowed, $r_{pin}$ is expressed by an equation (9) below.

$$r_{pin} = \frac{1}{2}\sqrt{-4\left(\left(h_{pin} + R - h_{bow} - \left(\frac{V_{flat} - V_{dome}}{\pi\left(\frac{c}{2}\right)^2}\right)\right)^2 - R^2\right)} \tag{9}$$

Figure 15:
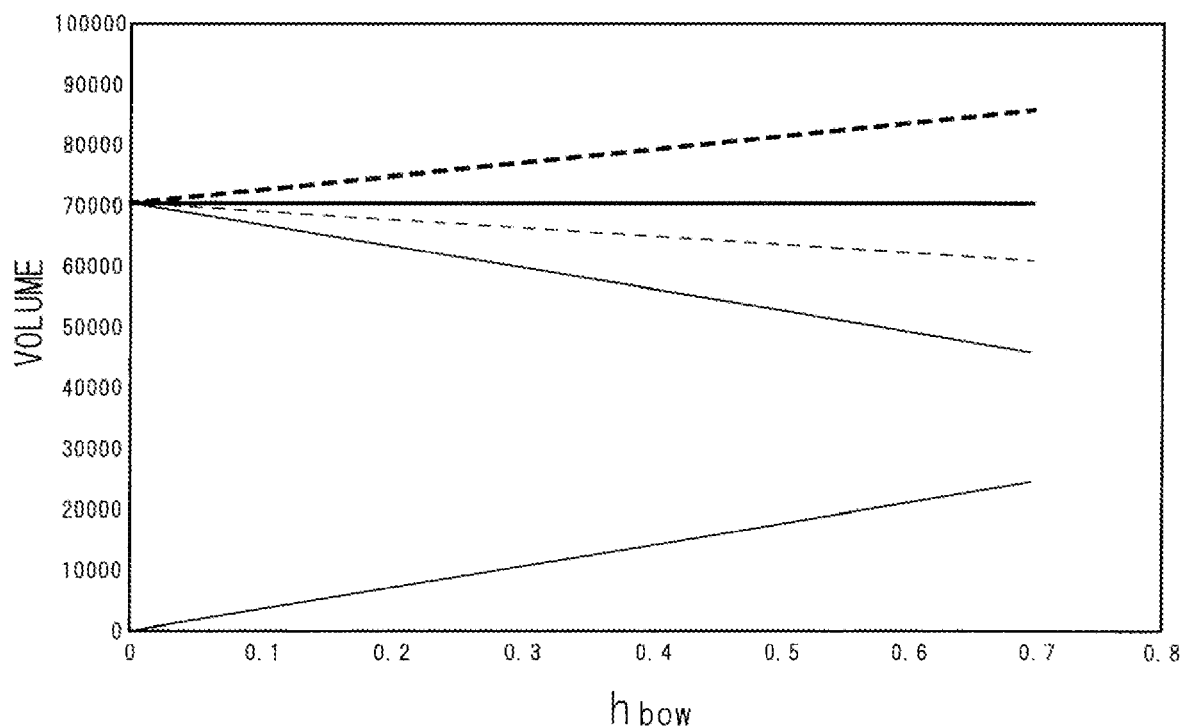
FIG. 15 shows an example of a result of simulation relating to the relationship among $V_{dome}$, $V_{disc}$, and $V_{total}$.

FIG. 15 shows an example of a result of simulation relating to the relationship among $V_{dome}$, $V_{disc}$, and $V_{total}$. In FIG. 15, the vertical axis represents the volume [mm$^3$] and the horizontal axis represents $h_{bow}$ [mm]. In an example of FIG. 15, a case of $r_{pin}$ satisfying the equation (9) (i.e., 106 mm) is shown in solid lines, and a case of $r_{pin}$ having another value (i.e., 135 mm) is shown in dotted lines when $D_{wafer}$ is 300 mm, and $h_{pin}$ is 1 mm. Furthermore, $V_{total}$ is shown in thick lines.

As shown in the example of FIG. 15, $V_{dome}$ increases with increasing $h_{bow}$ in both of the cases in a solid line and a dotted line. In FIG. 15, $V_{dome}$ in the solid line and $V_{dome}$ in the dotted line overlap each other. On the other hand, $V_{disc}$ decreases with increasing $h_{bow}$ in both of the cases in a solid line and a dotted line.

However, it can be seen that, in the case of $r_{pin}$ satisfying the equation (9) shown in solid lines, $V_{total}$ is maintained constant independently of $h_{bow}$, and the gap volumes are equal to each other before and after the substrate is bowed (i.e., in a case where $h_{bow}$ is 0 and in a case where $h_{bow}$ has a value other than 0).

<Suppression of Jump of Semiconductor Wafer W>

With reference to FIGS. 16, 17, 18, and 19, the height of a jump of the semiconductor wafer W from the substrate support pins 77 when the semiconductor wafer W supported by the substrate support pins 77 is bowed by thermal processing in the case of $r_{pin}$ satisfying the equation (9) and that in the case of $r_{pin}$ having another value are compared next.

Figure 16:
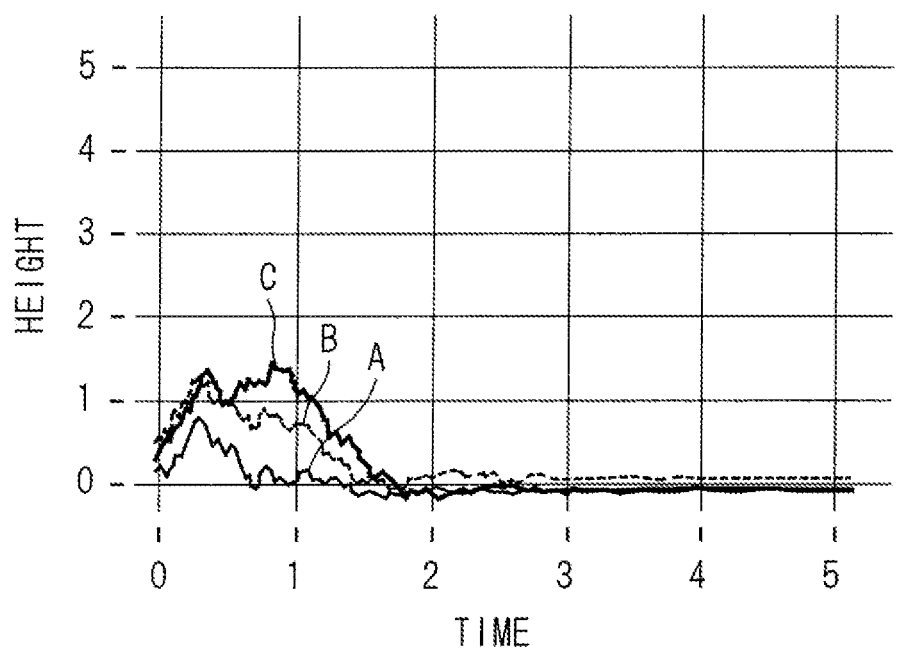
FIG. 16 shows a height of a jump when the semiconductor wafer supported by substrate support pins is experimentally caused to jump in a case of $r_{pin}$ satisfying an equation (9)

FIG. 16 shows the height of a jump when the semiconductor wafer W supported by the substrate support pins 77 is experimentally caused to jump in the case of $r_{pin}$ satisfying the equation (9) (i.e., 106 mm). A result shown in FIG. 16 corresponds to that in a case where irradiation with flash light is performed for a relatively short time using a flash lamp whose irradiation time is typically adjustable between 0.4 ms to 100 ms. In FIG. 16, the vertical axis represents the height of the jump (a relative value for comparison), and the horizontal axis represents time (a relative value for comparison).

FIG. 16 shows three graphs corresponding to cases where voltages having three patterns of values are applied to the flash lamps (A, B, and C patterns in ascending order of the values of the voltages), and the height of the jump of the semiconductor wafer W is suppressed to a relatively low value in each of the cases. The A, B, and C patterns are respectively shown in solid lines, dotted lines, and thick lines in the drawings hereafter.

Figure 17:
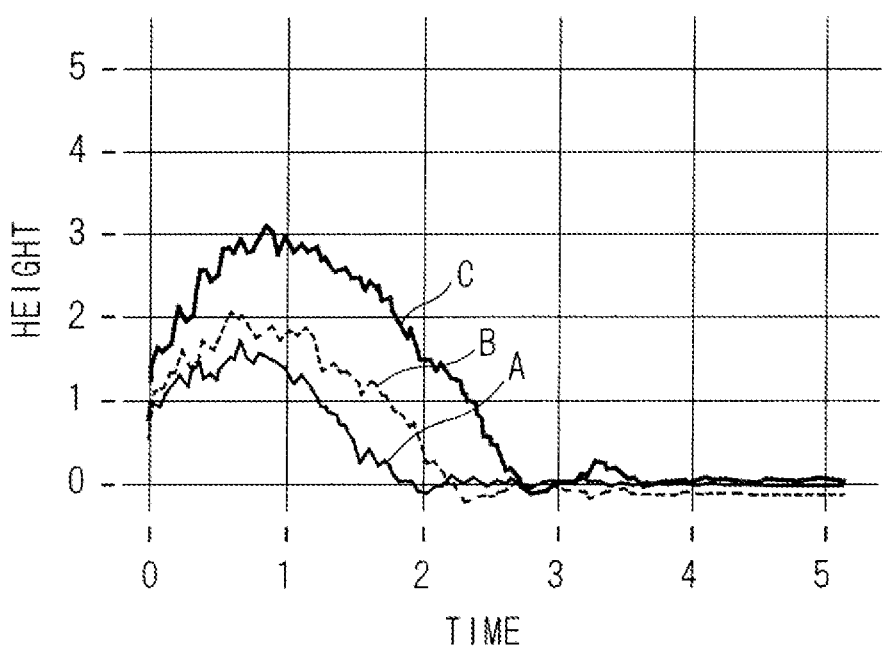
FIG. 17 shows a height of a jump when the semiconductor wafer supported by the substrate support pins is experimentally caused to jump in the case of $r_{pin}$ satisfying the equation (9)

FIG. 17 shows the height of a jump when the semiconductor wafer W supported by the substrate support pins 77 is experimentally caused to jump in the case of $r_{pin}$ satisfying the equation (9) (i.e., 106 mm). A result shown in FIG. 17 corresponds to that in a case where irradiation with flash light is performed for a longer time than the time in a case shown in FIG. 16. In FIG. 17, the vertical axis represents the height of the jump (a relative value for comparison), and the horizontal axis represents time (a relative value for comparison).

FIG. 17 shows three graphs corresponding to cases where voltages having three patterns, namely A, B, and C patterns, of values are applied to the flash lamps, and the height of the jump of the semiconductor wafer W is suppressed to a relatively low value in each of the cases.

Figure 18:
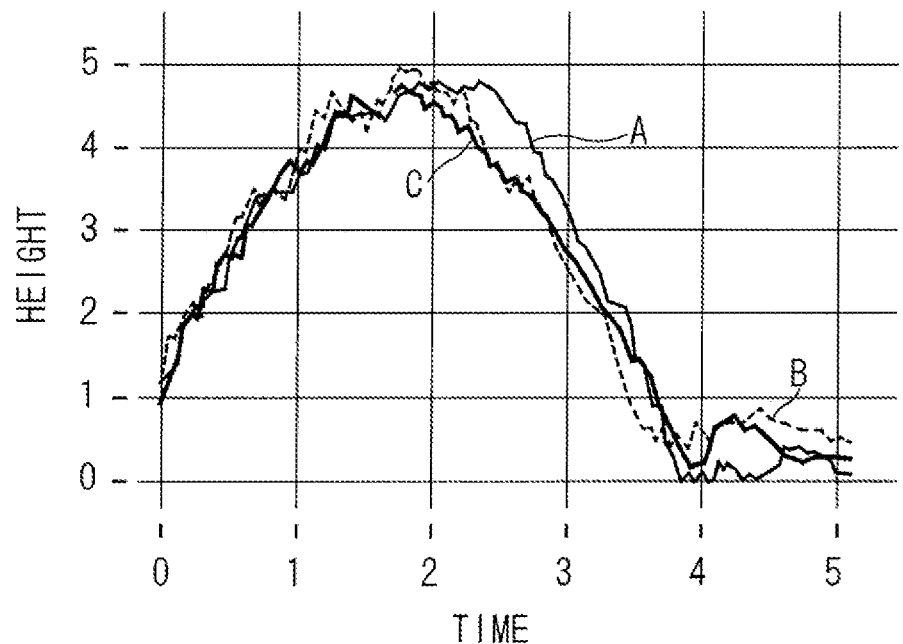
FIG. 18 shows a height of a jump when the semiconductor wafer supported by the substrate support pins is experimentally caused to jump in a case of $r_{pin}$ having another value.

FIG. 18 shows the height of a jump when the semiconductor wafer W supported by the substrate support pins 77 is experimentally caused to jump in the case of $r_{pin}$ having another value (i.e., 135 mm). A result shown in FIG. 18 corresponds to that in a case where irradiation with flash light is performed for the same time as the time in the case shown in FIG. 16. In FIG. 18, the vertical axis represents the height of the jump (a relative value for comparison), and the horizontal axis represents time (a relative value for comparison).

FIG. 18 shows three graphs corresponding to cases where voltages having three patterns, namely A, B, and C patterns, of values are applied to the flash lamps, and the height of the jump of the semiconductor wafer W has a greater value than that in the case shown in FIG. 16 in each of the cases.

Figure 19:
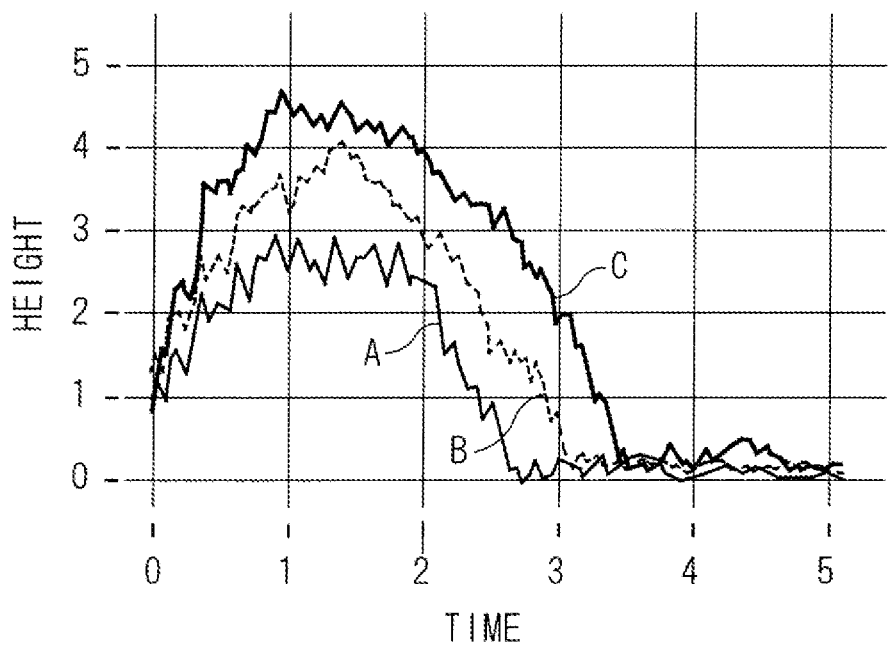
FIG. 19 shows a height of a jump when the semiconductor wafer supported by the substrate support pins is experimentally caused to jump in the case of $r_{pin}$ having another value.

FIG. 19 shows the height of a jump when the semiconductor wafer W supported by the substrate support pins 77 is experimentally caused to jump in the case of $r_{pin}$ having another value (i.e., 135 mm). A result shown in FIG. 19 corresponds to that in a case where irradiation with flash light is performed for the same time as the time in the case shown in FIG. 17. In FIG. 19, the vertical axis represents the height of the jump (a relative value for comparison), and the horizontal axis represents time (a relative value for comparison).

FIG. 19 shows three graphs corresponding to cases where voltages having three patterns, namely A, B, and C patterns, of values are applied to the flash lamps, and the height of the jump of the semiconductor wafer W has a greater value than that in the case shown in FIG. 17 in each of the cases.

As shown in FIGS. 16, 17, 18, and 19, the height of the jump of the semiconductor wafer W is lower in the case of $r_{pin}$ satisfying the equation (9) than in the case of $r_{pin}$ having another value.

<Effect Produced by Embodiment Described Above>

An example of an effect produced by the embodiment described above will be described next. In description below, the effect will be described based on a specific configuration having been described in the embodiment described above, but the specific configuration may be replaced by another specific configuration having been described in the description of the present application to the extent that a similar effect is produced.

According to the embodiment described above, the substrate support device includes the holding plate 75 and the plurality of substrate support pins 77. The holding plate 75 opposes the substrate. The substrate herein corresponds to the semiconductor wafer W, for example, and is bowable by being heated by irradiation with flash light. The substrate support pins 77 are provided on the holding plate 75. The substrate support pins 77 support the semiconductor wafer W. The plurality of substrate support pins 77 are arranged at locations where the volume of the space between the holding plate 75 and the semiconductor wafer W in the unbowed state and the volume of the space between the holding plate 75 and the semiconductor wafer W in the bowed state are equal to each other.

According to such a configuration, even in a case where the semiconductor wafer W is bowed by flash light, a jump of the semiconductor wafer W from the substrate support pins 77 can be suppressed, and, as a result, breakage of the semiconductor wafer W can be suppressed.

A similar effect can be produced in a case where another configuration having not been described in the description of the present application is added to the above-mentioned configuration as appropriate, that is, in a case where another configuration in the description of the present application having not been referred to as the above-mentioned configuration is added to the above-mentioned configuration as appropriate.

According to the embodiment described above, the substrate support pins 77 are arranged annularly in plan view. According to such a configuration, in a case where the semiconductor wafer W is bowed to have an ideal spherical surface, the substrate support pins 77 can properly support the semiconductor wafer W in the bowed state.

According to the embodiment described above, the semiconductor wafer W is circular in plan view. According to such a configuration, in a case where the semiconductor wafer W is bowed to have an ideal spherical surface, a jump of the semiconductor wafer W from the substrate support pins 77 can be suppressed.

According to the embodiment described above, the distance $r_{pin}$ between each of the substrate support pins 77 and the center portion of the semiconductor wafer W in plan view satisfies the above-mentioned equation (9), where $h_{pin}$ is the height of each of the substrate support pins 77, R is the radius of curvature of the semiconductor wafer W in the bowed state, $h_{bow}$ is the height of the semiconductor wafer W in the bowed state, $D_{wafer}$ is the diameter of the semiconductor wafer W in the unbowed state, and c is the diameter of the semiconductor wafer W in the bowed state in plan view. According to such a configuration, the volume of the space between the holding plate 75 and the semiconductor wafer W before the semiconductor wafer W is bowed and that after the semiconductor wafer W is bowed are equal to each other, so that the restoring force generated at the bow can be suppressed to suppress a jump of the semiconductor wafer W from the substrate support pins 77.

According to the embodiment described above, the thermal processing apparatus includes the above-mentioned substrate support device and the flash lamps FL for irradiating the semiconductor wafer W with flash light. According to such a configuration, in a case where rapid thermal expansion occurs on the upper surface of the semiconductor wafer W irradiated with flash light, and the semiconductor wafer W is bowed so that the upper surface thereof is convex, a jump of the semiconductor wafer W from the substrate support pins 77 can be suppressed.

According to the embodiment described above, in the substrate support method, the holding plate 75 on which the plurality of substrate support pins 77 for supporting the semiconductor wafer W bowable by being heated by irradiation with flash light is opposed with the semiconductor wafer W. The plurality of substrate support pins 77 are arranged at locations where the volume of the space between the holding plate 75 and the semiconductor wafer W in the unbowed state and the volume of the space between the holding plate 75 and the semiconductor wafer W in the bowed state are equal to each other.

According to such a configuration, even in a case where the semiconductor wafer W is bowed by flash light, a jump of the semiconductor wafer W from the substrate support pins 77 can be suppressed, and, as a result, breakage of the semiconductor wafer W can be suppressed.

A processing order can be changed unless any particular limitation is imposed.

A similar effect can be produced in a case where another configuration having not been described in the description of the present application is added to the above-mentioned configuration as appropriate, that is, in a case where another configuration in the description of the present application having not been referred to as the above-mentioned configuration is added to the above-mentioned configuration as appropriate.

According to the embodiment described above, in the thermal processing method, the semiconductor wafer W supported by the above-mentioned substrate support method is irradiated with flash light using the flash lamps FL. According to such a configuration, even in a case where rapid thermal expansion occurs on the upper surface of the semiconductor wafer W irradiated with flash light, and the semiconductor wafer W is bowed so that the upper surface thereof is convex, a jump of the semiconductor wafer W from the substrate support pins 77 can be suppressed.

Modifications of Embodiment Described Above

In the embodiment described above, material properties of, materials for, dimensions of, shapes of, a relative positional relationship among, or conditions for performance of components are sometimes described, but they are each one example in all aspects, and are not limited to those described in the description of the present application.

Numerous modifications not having been described and the equivalent can be devised within the scope of the technology disclosed in the description of the present application. For example, a case where at least one component is modified, added, or omitted is included.

In a case where a name of a material and the like are described in the above-mentioned embodiment without being particularly designated, an alloy and the like containing an additive in addition to the material may be included unless any contradiction occurs.

While the invention has been shown and described in detail, the foregoing description is in all aspects illustrative and not restrictive. It is therefore understood that numerous modifications and variations can be devised without departing from the scope of the invention.

What is claimed is:

1. A substrate support method comprising the steps of:
opposing a holding plate on which a plurality of substrate support pins are provided with a substrate bowable by being heated by irradiation with flash light, said plurality of substrate support pins being for supporting said substrate; and
arranging said plurality of substrate support pins at locations where a volume of a space between said holding plate and said substrate in an unbowed state and a volume of a space between said holding plate and said substrate in a bowed state are equal to each other, wherein a distance $r_{pin}$, in plan view, between each of said substrate support pins and a center portion of said substrate being circular satisfies:

$$r_{pin} = \frac{1}{2}\sqrt{-4\left(\left(h_{pin} + R - h_{bow} - \left(\frac{V_{flat} - V_{dome}}{\pi\left(\frac{c}{2}\right)^2}\right)\right)^2 - R^2\right)}$$

where $h_{pin}$ is a height of each of said substrate support pins, R is a radius of curvature of said substrate in said bowed state, $h_{bow}$ is a height of said substrate in said bowed state, $D_{wafer}$ is a diameter of said substrate in said unbowed state, and c is a diameter of said substrate in said bowed state in plan view.

2. A thermal processing method comprising the step of irradiating said substrate supported by said substrate support method according to claim 1 with said flash light using a flash lamp.

* * * * *